(12) United States Patent
Ishihara et al.

(10) Patent No.: US 7,000,352 B2
(45) Date of Patent: Feb. 21, 2006

(54) BACKDOOR SYSTEM OF VEHICLE HAVING PRESSURE SENSOR FOR DETECTING OBJECT PINCHED BY BACKDOOR

(75) Inventors: Hidenori Ishihara, Hamamatsu (JP); Hirokazu Tsuda, Toyohashi (JP); Takahiro Iida, Toyohashi (JP)

(73) Assignee: Asmo Co., Ltd., Shizuoka-ken (JP)

( * ) Notice: Subject to any disclaimer, the term of this patent is extended or adjusted under 35 U.S.C. 154(b) by 0 days.

(21) Appl. No.: 10/077,862

(22) Filed: Feb. 20, 2002

(65) Prior Publication Data

US 2002/0113602 A1 Aug. 22, 2002

(30) Foreign Application Priority Data

Feb. 22, 2001 (JP) ............................. 2001-046456

(51) Int. Cl.
*E05F 15/04* (2006.01)
(52) U.S. Cl. ............................. 49/28; 49/26; 296/146.8
(58) Field of Classification Search .................. 49/26, 49/27, 28, 340; 318/466, 469; 200/61.44; 296/146.8, 50
See application file for complete search history.

(56) References Cited

U.S. PATENT DOCUMENTS

| | | | | |
|---|---|---|---|---|
| 2,595,291 A | * | 5/1952 | Ramsey et al. ............. 318/275 |
| 4,855,653 A | * | 8/1989 | Lemirande ................... 318/282 |
| 5,448,856 A | * | 9/1995 | Moore et al. .................. 49/340 |
| 5,531,498 A | * | 7/1996 | Kowall ..................... 296/146.4 |
| 5,563,483 A | * | 10/1996 | Kowall et al. .............. 318/283 |
| 5,851,050 A | * | 12/1998 | Squire et al. ............ 296/146.4 |
| RE36,267 E | * | 8/1999 | Moore et al. .................. 49/340 |
| 5,982,126 A | * | 11/1999 | Hellinga et al. ............ 318/468 |
| 6,297,605 B1 | * | 10/2001 | Butler et al. ................. 318/466 |
| 6,316,846 B1 | * | 11/2001 | Kashiwazaki et al. ...... 307/119 |
| 6,339,305 B1 | * | 1/2002 | Ishihara et al. ............. 318/445 |
| 6,347,482 B1 | * | 2/2002 | Takiguchi et al. ............. 49/28 |
| 6,646,398 B1 | * | 11/2003 | Fukazawa et al. ......... 318/445 |
| 6,719,356 B1 | * | 4/2004 | Cleland et al. .......... 296/146.8 |
| 2002/0157313 A1 | * | 10/2002 | Fukazawa et al. ............ 49/26 |
| 2003/0115801 A1 | * | 6/2003 | Goscicki et al. ............... 49/26 |

FOREIGN PATENT DOCUMENTS

JP A-10-252349 9/1998

* cited by examiner

*Primary Examiner*—Gregory J. Strimbu
(74) *Attorney, Agent, or Firm*—Posz Law Group, PLC

(57) ABSTRACT

A pinched object detection apparatus includes a couple of pressure sensors arranged at lateral end portions of a backdoor of a vehicle and another couple of pressure sensors arranged at lateral end portions of a rear opening of the vehicle. An object pinched between the lateral end portions of the rear gate and the backdoor can be detected with the corresponding pressure sensor arranged at the backdoor or pressure sensor arranged at the rear opening. Furthermore, an object pinched between the lateral end of the rear opening and an opposing gas damper can be detected with the corresponding pressure sensor arranged at the rear opening.

7 Claims, 18 Drawing Sheets

BACKDOOR SYSTEM OF VEHICLE HAVING PRESSURE SENSOR FOR DETECTING OBJECT PINCHED BY BACKDOOR

CROSS REFERENCE TO RELATED APPLICATION

This application is based on and incorporates herein by reference Japanese Patent Application No. 2001-46456 filed on Feb. 22, 2001 and Japanese Patent Application No. 2001-399012 filed on Dec. 28, 2001.

BACKGROUND OF THE INVENTION

1. Field of the Invention

The present invention relates to a backdoor system of a vehicle having a pressure sensor for detecting an object, which is pinched by a backdoor of the vehicle.

2. Description of Related Art

An automatic slide door system has been often used as a slide door system for opening and closing a side door opening arranged adjacent a rear seat of a vehicle, such as a wagon, a van, or a recreation vehicle. The automatic slide door system moves a door panel with a drive force of a motor or the like to open and close the side door opening.

In general, in the above described type of vehicle, a luggage room and a passenger room are not physically separated from each other, and a backdoor is provided at a rear opening of the vehicle. The backdoor is swung about a swing axis, which generally extends in a widthwise direction or lateral direction of the vehicle near a top end of the vehicle. By swinging the backdoor toward and away from the rear gate, the rear opening is closed and opened, respectively.

In such a backdoor system, the closing and opening operation of the backdoor has been manually conducted. When the rear opening is fully opened, the backdoor is raised to its top end position, so that the closing operation of the backdoor is bothersome, and thus it is desired to automatically operate the backdoor with driving force, such as of a motor, like in the case of the slide door.

In such an automatic backdoor system, it is conceivable to use a pinched object detection apparatus used in the automatic slide door system to detect the object pinched by the door.

In the pinched object detection apparatus of the automatic slide door system, a pressure sensor is arranged at a leading end portion of the door panel on the door opening side thereof. When an object is pinched between the closing door panel and an inner peripheral portion of the door opening, pressing force is applied to the object, which in turn, applies reaction force to the pressure sensor, resulting in detection of the reaction force by the pressure sensor.

In the backdoor system, two shock absorbing gas dampers are arranged at opposed lateral ends of the vehicle, respectively, between the rear gate and the backdoor to restrain rapid swing motion of the backdoor when the backdoor is swung toward the rear gate.

Each gas damper has a tubular cylinder (damper case) and a piston. One of the cylinder and the piston is pivotably connected to the rear gate, and the other one is pivotably connected to the backdoor.

When the backdoor is swung toward and away from the rear gate to close and open the rear opening, respectively, each gas damper pivots about the connection between the gas damper and the backdoor and also about the connection between the gas damper and the rear gate, and each piston is retracted into and extended from the cylinder, respectively.

When the backdoor is swung toward the rear gate, the object could be pinched between the backdoor and the vehicle body, as described above, and also could be pinched between the gas damper and the vehicle body. Depending on a location of the gas damper in its swing path, the gas damper could be positioned closer to the vehicle body than is the backdoor. In such a case, if the pinched object detection apparatus similar to that of the automatic slide door system is applied to the backdoor, it is difficult to detect the object pinched between the gas damper and the vehicle body.

SUMMARY OF THE INVENTION

The present invention addresses the above disadvantages. Thus, it is an objective of the present invention to provide a pinched object detection apparatus capable of effectively detecting an object pinched between a movable body, such as a backdoor, and a stationary body, such as a vehicle body, and also capable of effectively detecting an object pinched between a cushioning means, such as a gas damper, and the stationary body.

To achieve the objective of the present invention, there is provided a pinched object detection apparatus for an opening and closing mechanism. The opening and closing mechanism swings a movable body toward and away from a gate formed in a stationary body to close and open the opening of the gate, respectively. The pinched object detection apparatus detects a pinched object, which is pinched between the movable body and the stationary body when the movable body is swung toward the gate. The pinched object detection apparatus includes at least one pressure sensor for sensing pressing force applied thereto by the pinched object. The at least one pressure sensor is placed in at least one of an inner peripheral portion of the opening of the gate of the stationary body and an outer peripheral portion of the movable body.

To achieve the objective of the present invention, there is alternatively provided a pinched object detection apparatus for an opening and closing mechanism. The opening and closing mechanism includes a movable body and at least one cushioning means. The movable body is swung toward and away from a gate formed in a stationary body to close and open the gate opening, respectively. The at least one cushioning means is placed inward of the gate near an inner peripheral portion of the gate and has one end pivotably connected to the movable body and the other end pivotably connected to the stationary body. The at least one cushioning means is swung synchronously with swing motion of the movable body and restrains the swing motion of the movable body toward the gate. The pinched object detection apparatus detects a pinched object, which is pinched when the movable body is swung toward the gate. The pinched object detection apparatus includes at least one pressure sensor for sensing pressing force applied thereto by the pinched object which is pinched by the at least one cushioning means and the stationary body when the movable body is swung toward the gate. The at least one pressure sensor is attached to at least one of the following: a part of the inner peripheral portion of the opening, which is located in an imaginary extension of a moving path of the at least one cushioning means; and the at least one cushioning means.

BRIEF DESCRIPTION OF THE DRAWINGS

The invention, together with additional objectives, features and advantages thereof, will be best understood from the following description, the appended claims and the accompanying drawings in which:

DETAILED DESCRIPTION OF THE INVENTION

Figure 1:
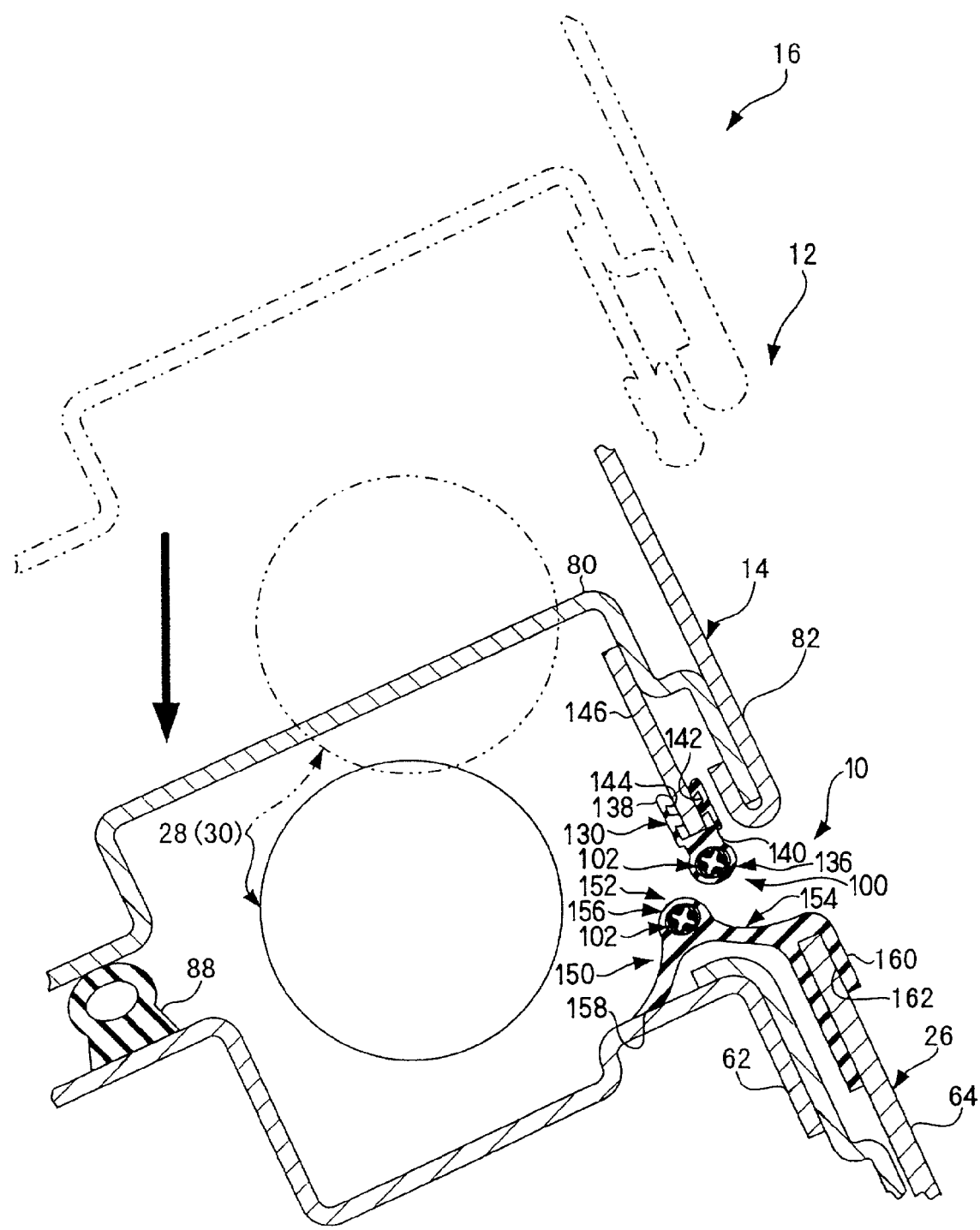
FIG. 1 is a partial cross-sectional view of a vehicle equipped with a pinched object detection apparatus according to a first embodiment of the present invention.

Various embodiments of the present invention will be described with reference to the accompanying drawings. Throughout the drawings, like reference characters are used to designate like elements.

(First Embodiment)

A first embodiment of the present invention will be described with reference to FIGS. 1 to 9. FIG. 7 shows a vehicle 16, which is equipped with a pinched object detection apparatus 10 (FIG. 1) according to the first embodiment of the present invention. The pinched object detection apparatus 10 is used to detect an object pinched by a backdoor (acting as a movable body) 14 of an automatic backdoor system (acting as an opening and closing mechanism) 12 (FIG. 1). A structure of the automatic backdoor system 12 will be first briefly described.

As shown in FIG. 7, a rear gate (acting as a gate) 18 is arranged at a rear end of the vehicle 16. The rear gate 18 communicates between a luggage room 22, which is located on a rear side of a rear end passenger seat 20, and outside of the vehicle 16. Luggage or the like can be placed in the luggage room 22 from the outside of the vehicle 16 through the rear gate 18. Alternatively, the luggage or the like in the luggage room 22 can be moved away from the luggage room 22 to the outside of the vehicle 16 through the rear gate 18.

In the following description, when a positional relationship of each component with respect to the backdoor 14 is described, it should be assumed that the backdoor 14 is in a fully closed state where the backdoor 14 fully closes the opening defined by the rear gate 18 unless otherwise stated.

The backdoor 14 is pivotably supported by the vehicle 16 via hinges (not shown) arranged at a roof panel 24 in such a manner that the backdoor 14 is swung about a swing axis, which extends in a widthwise direction or a lateral direction of the vehicle 16, within a predetermined angular range. When the backdoor 14 is swung to its lowest position in the vehicle 16, the backdoor 14 fully closes the opening defined by the rear gate 18.

A couple of gas dampers (each acting as a cushioning means or a damper) 28 are arranged at rear end portions (acting as stationary bodies) of lateral walls 26 of the vehicle 16 (i.e., the opposed lateral end portions of the rear gate 18 spaced in the lateral direction of the vehicle 16). Each gas damper 28 includes a cylinder (acting as a damper case) 30 and a piston 32. The cylinder 30 is generally cylindrical and has a base at one end and an opening at the other end. The opening of the cylinder 30 is opened generally downward in a vertical direction of the vehicle 16. The piston 32 is received in the cylinder 30 in a freely movable manner with respect to the cylinder 30. The base of each cylinder 30 is spaced away from an upper end of the backdoor 14 (i.e., a connection between the backdoor 14 and the corresponding hinge) toward a lower end of the backdoor 14 near a corresponding lateral end portion of the backdoor 14.

A distal end portion of each piston 32 is freely pivotably connected to a corresponding bracket 34 formed integrally with the rear end portion of the corresponding lateral wall 26. When the backdoor 14 is swung upwardly (i.e., away from the rear gate 18), the piston 32 of each gas damper 28 extends out from the corresponding cylinder 30 of the gas damper 28.

On the other hand, when the backdoor 14 is swung downwardly (i.e., toward the rear gate 18), each piston 32 is retracted into the corresponding cylinder 30.

As described above, each piston 32 is extended and retracted relative to the corresponding cylinder 30 in a synchronous manner with the swing motion of the backdoor 14. Furthermore, gas, such as air or nitrogen gas, is filled within each cylinder 30. Thus, the gas filled within each cylinder 30 provides resistance against the extension and retraction of the corresponding piston 32. As a result, rapid extension and retraction of each piston 32 is restrained by the gas filled within the corresponding cylinder 30. In this way, rapid swing motion of the backdoor 14 is restrained.

Furthermore, with reference to FIG. 1, shape and size of each gas damper 28 are chosen such that when the backdoor 14 is positioned to fully close the opening defined by the rear gate 18, each gas damper 28 is positioned between an inwardly bent portion of an inner panel 62, which constitutes the corresponding lateral wall 26 of the vehicle 16, and an inner panel 80, which constitutes the backdoor 14 in cooperation with an outer panel 82.

Also, as shown in FIG. 1, a weather strip 88 is connected to the bent portion of the inner panel 62. The weather strip 88 is made of a rubber material or a resilient synthetic resin material, which exhibits a resiliency similar to that of the rubber material. When the backdoor 14 is positioned to hilly close the opening defined by the rear gate 18, the weather strip 88 engages with the inner panel 80 of the backdoor 14 and is resiliently deformed to closely or sealingly fit against the inner panel 80.

A backdoor motor (acting as a driving means) 40 (FIG. 6) is received between the roof panel 24 and a roof headlining (not shown), which is arranged below the roof panel 24. The backdoor motor 40 is mechanically connected to the backdoor 14 through a speed reducing means (not shown), such as a speed reducing gear, and a coupling means (not shown), such as a wire, a pulley and a coupling gear. When the backdoor motor 40 is rotated in a forward direction, the backdoor 14 is swung away from the rear gate 18. On the other hand, when the backdoor motor 40 is rotated in a backward direction, the backdoor 14 is swung toward the rear gate 18.

Figure 6:
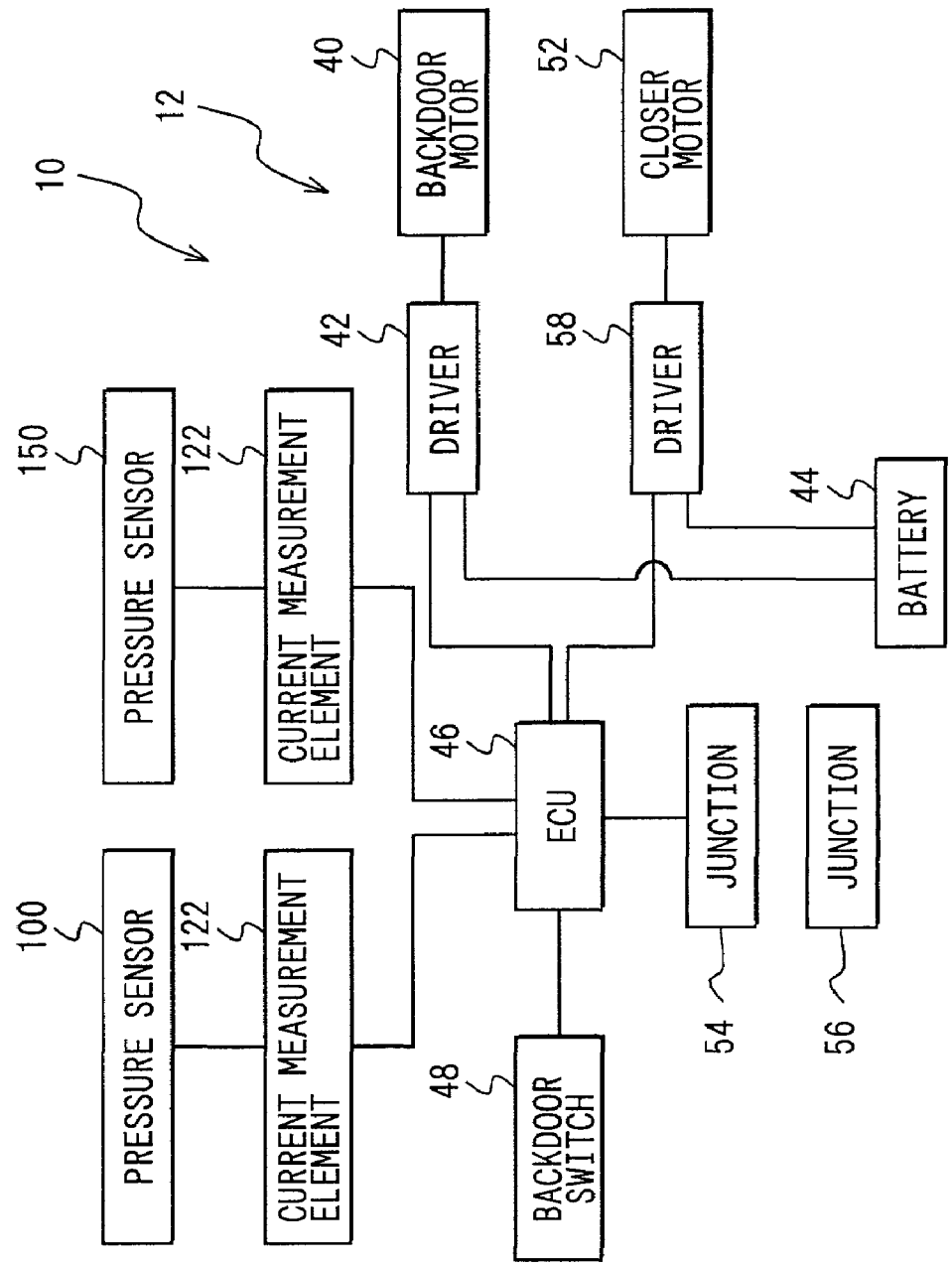
FIG. 6 is a systematic block diagram, showing a structure of the pinched object detection apparatus of the first embodiment.
Figure 7:
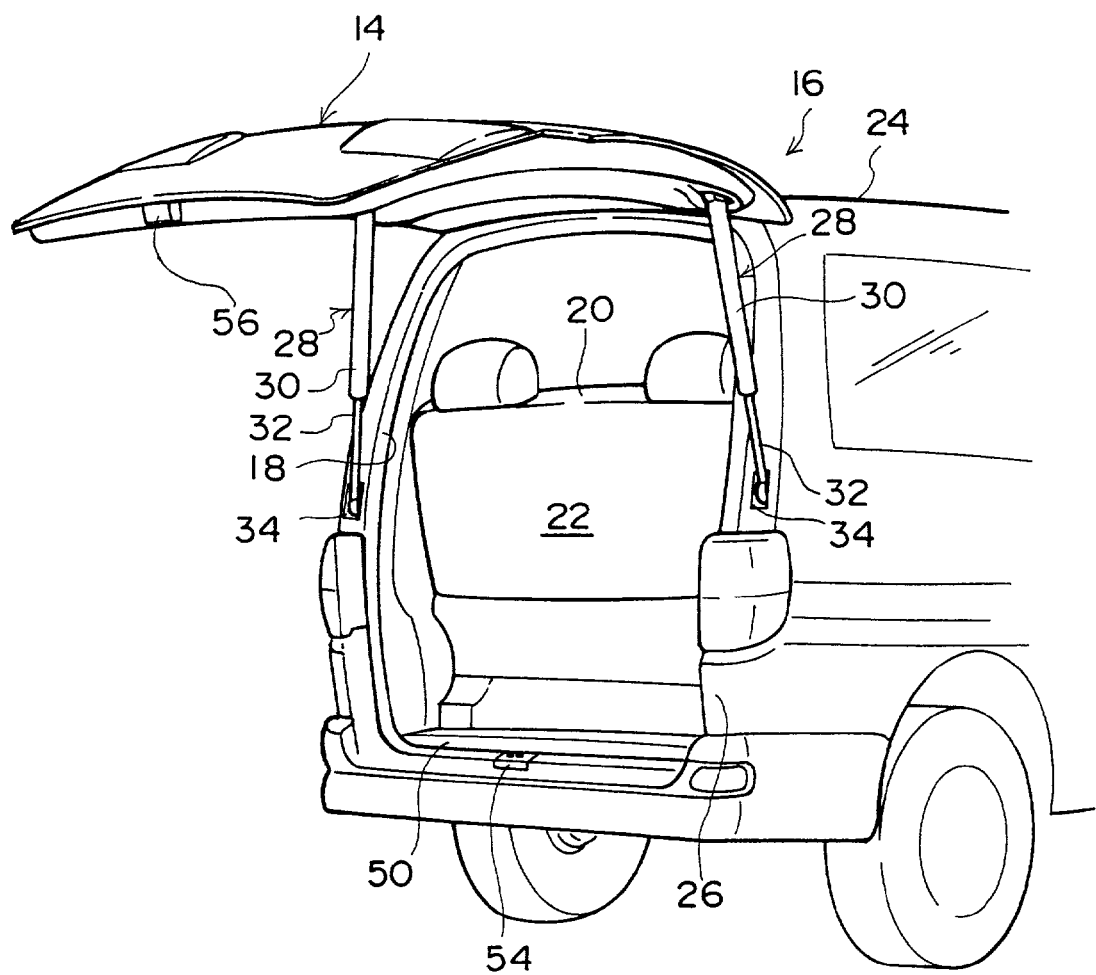
FIG. 7 is a partial perspective view of the vehicle equipped with the pinched object detection apparatus of the first embodiment.

Furthermore, as shown in FIG. 6, the backdoor motor 40 is electrically connected to a battery 44 through a driver 42 installed in the vehicle 16 for controlling the backdoor motor 40 and is driven upon receiving electric power from the battery 44. Furthermore, the backdoor motor 40 is electrically connected to an electronic control unit (ECU) 46, which acts as a control means, through the driver 42 and is further electrically connected to a backdoor switch (acting as an operating means) 48 through the ECU 46.

The backdoor switch 48 is positioned near a driver's seat (not shown) or the rear passenger seat 20 in the vehicle 16. When the backdoor switch 48 is activated, an operation signal (electrical signal) from the backdoor switch 48 is inputted to the ECU 46. Thus, the ECU 46 controls the driver 42 based on the operation signal to achieve forward rotation, backward rotation or stop of the backdoor motor 40.

A closer motor (acting as a driving means) 52, which constitutes a closer assembly, is arranged near a rear end of the floor panel 50 of the vehicle 16. Besides the closer motor 52, the closer assembly also includes a couple of junctions 54, 56 (FIG. 7).

The structure of the pinched object detection apparatus 10 will be further described below.

Figure 2:
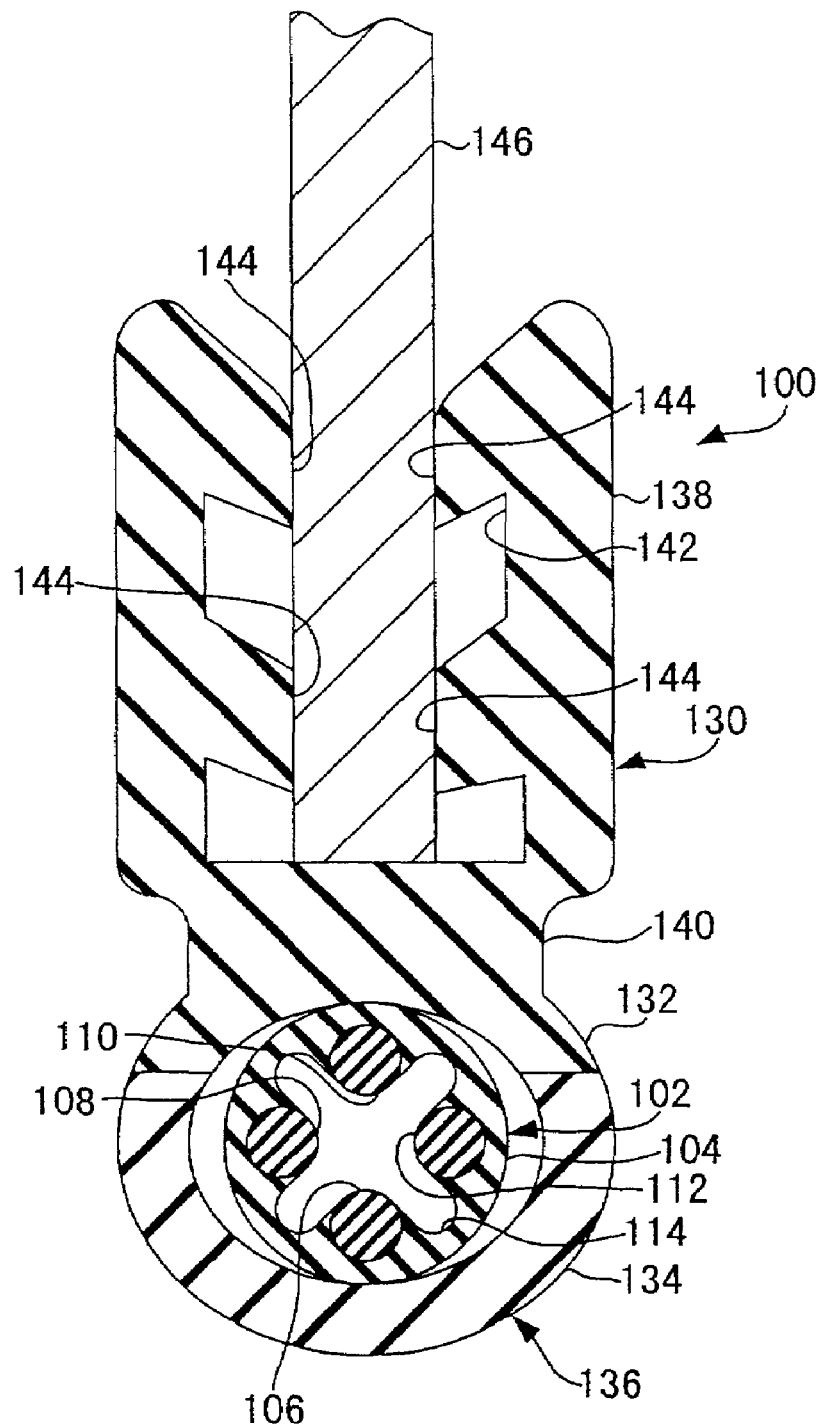
FIG. 2 is an enlarged cross-sectional view of a pressure sensor of the pinched object detection apparatus of FIG. 1, which is attached to a backdoor of the vehicle.

With reference to FIG. 1, the pinched object detection apparatus 10 includes a couple of pressure sensors 100 (only one is shown in FIG. 1), which extend along outer surfaces of lateral end portions of the backdoor 14, respectively. With reference to FIG. 2, each pressure sensor 100 includes a sensor main body 102. The sensor main body 102 is an elongated body, which has a generally circular cross-section and extends along the corresponding lateral end portion of the backdoor 14. The sensor main body 102 includes an outer sheath portion 104 and four electrode wires (acting as electrodes) 106, 108, 110, 112.

Figure 4:
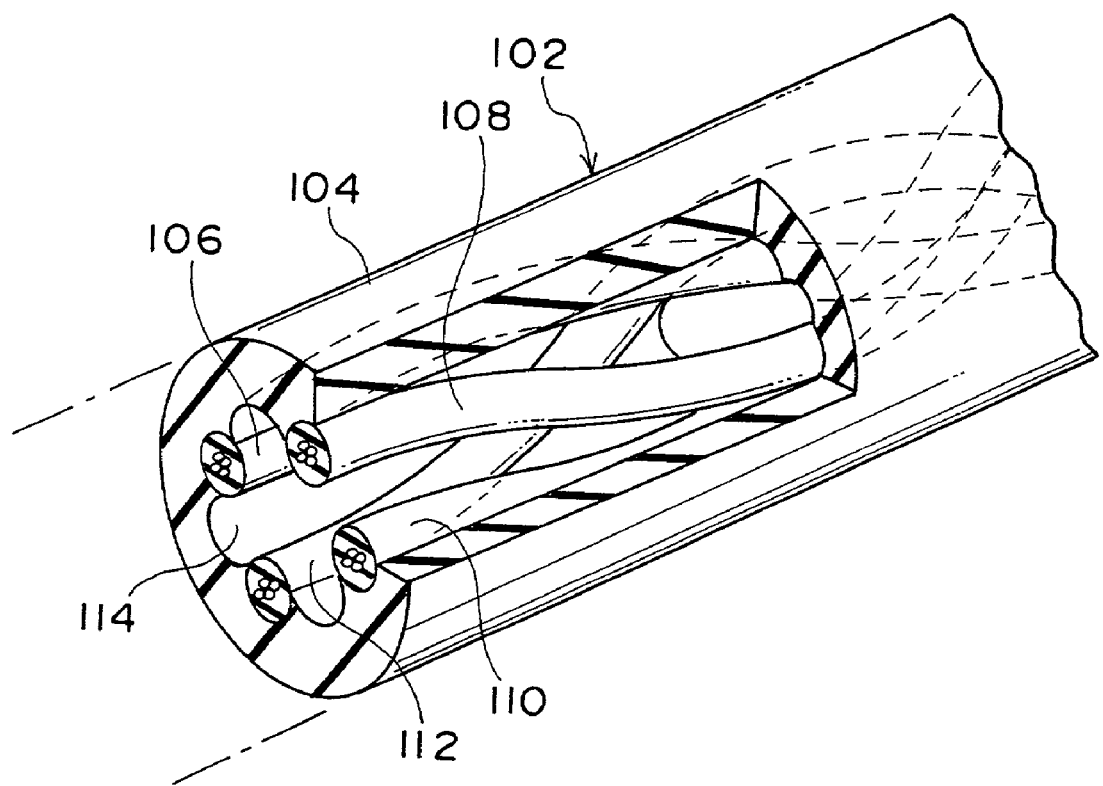
FIG. 4 is a fragmented partial perspective view of a sensor main body of the pressure sensor attached to the backdoor of the vehicle.

The outer sheath portion 104 is an elongated body made of a resilient dielectric material, such as a rubber material or a soft synthetic resin material. A cross hole 114 having a cross-shaped cross-section is arranged inward of the outer sheath portion 104 to extend in a longitudinal direction of the outer sheath portion 104. As shown in FIG. 4, the cross hole 114 progressively varies its circumferential position about a center axis of the outer sheath portion 104 along the longitudinal direction of the outer sheath portion 104. That is, each one of four radial ends of the cross hole 114 shifts its circumferential position along a corresponding spiral path in the longitudinal direction of the outer sheath portion 104.

On the other hand, each electrode wire 106–112 is a resilient stranded wire, which is formed by stranding a plurality of electrically conductive thin wires, such as thin copper wires, and is covered with an electrically conductive rubber. The electrode wires 106–112 are radially spaced from each other by the cross hole 114 and are spirally wound along a length of the cross hole 114. Furthermore, the electrode wires 106–112 are integrally secured to the inner peripheral surface portion of the cross hole 114. Thus, when the outer sheath portion 104 is resiliently deformed upon application of external force thereto, the electrode wires 106–112 are flexed. Furthermore, when the outer sheath portion 104 is largely, resiliently deformed to cause collapse of the cross hole 114, the electrode wire 106 or 110 contacts with the electrode wire 108 or 112 to conduct the electrical current therebetween. Thereafter, when the outer sheath portion 104 is restored to its original shape, each electrode wire 106–112 is also restored to its original shape.

Figure 5:
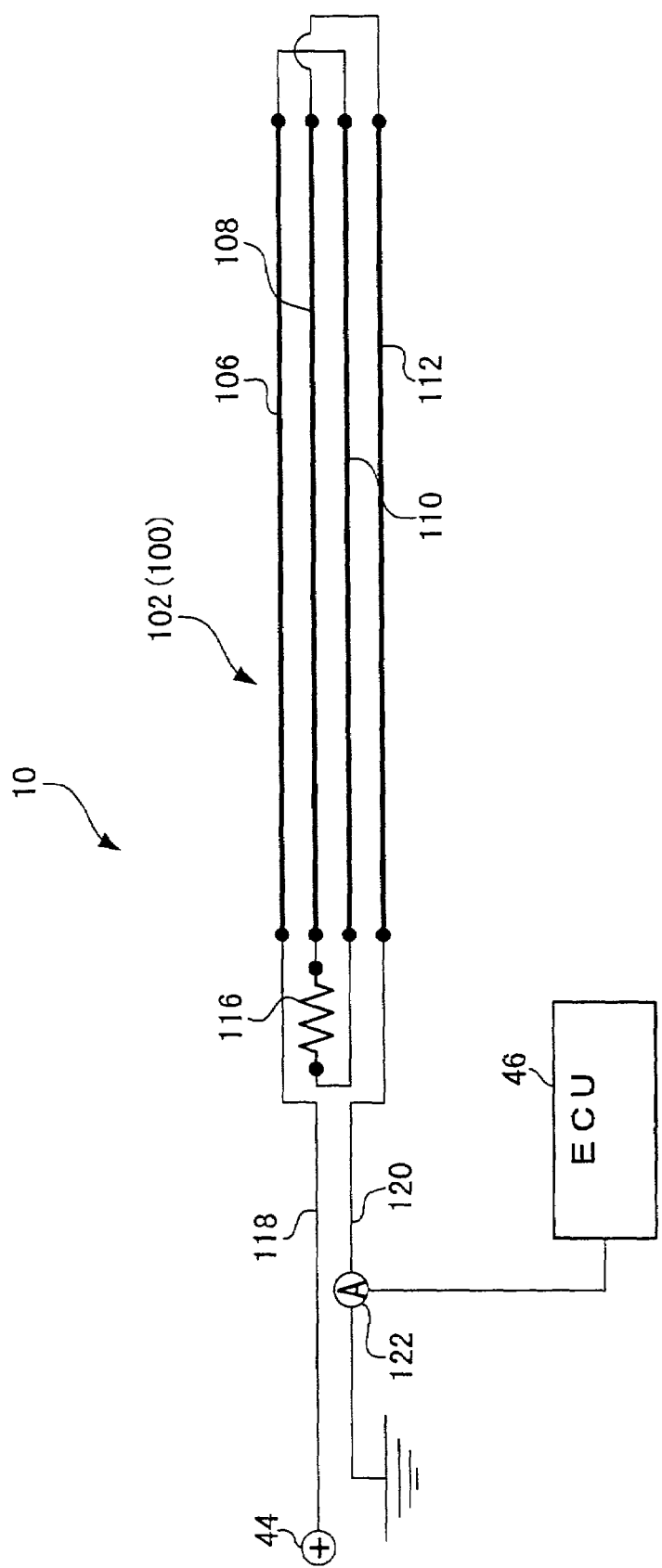
FIG. 5 is a circuit diagram of the pressure sensor attached to the backdoor of the vehicle.

With reference to a circuit diagram of FIG. 5, the electrode wire 106 and the electrode wire 110 are electrically connected one another at one longitudinal end of the sensor main body 102, and the electrode wire 108 and the electrode wire 112 are electrically connected to one another at the one longitudinal end of the sensor main body 102. Furthermore, the electrode wire 108 and the electrode wire 110 are electrically connected one another in series through a resistor 116 at the other longitudinal end of the sensor main body 102.

Furthermore, the other longitudinal end of the electrode wire 106 is electrically connected to the battery 44 through a lead wire 118, another type of electrically connecting means and a sensor power supply controlling means, which controls power supply to the sensor main body 102.

Furthermore, the other longitudinal end of the electrode wire 112 is grounded through a lead wire 120 and another type of electrically connecting means. An electrical current measurement element 122 is electrically connected to the lead wire 120 or the other type of electrically connecting means. The electrical current measurement element 122 measures the electrical current, which passes through the sensor main body 102. When an electrical current value of the electrical current, which passes through the sensor main body 102, is changed from one predetermined value to another predetermined value, the electrical current measurement element 122 outputs an electrical signal to the ECU 46.

When the electrode wire 106 or 110 contacts with the electrode wire 108 or 112, and the electrical signal is inputted to the ECU 46, the ECU 46 controls the drivers 42, 58 to rotate the backdoor motor 40 and the closer motor 52 in the forward direction for a predetermined amount to raise the back door 14.

The amount of the forward rotation of each of the backdoor motor 40 and the closer motor 52 is not limited to any specific value.

Furthermore, as shown in FIGS. 1 and 2, each pressure sensor 100 has a protector (acting as a holding means) 130. With reference to FIG. 2, the protector 130 includes a tubular portion 136. The tubular portion 136 has a rigid portion 132 and a soft portion 134. The rigid portion 132 is made of a rubber material or a synthetic resin material, which has a rigidity higher than that of the outer sheath portion 104 of the sensor main body 102. The soft portion 134 is integrally formed with the rigid portion 132 and is made of a rubber material or a synthetic resin material, which has rigidity lower than that of the outer sheath portion 104.

An inner circumference of the tubular portion 136 is shaped into a generally ellipsoidal shape or a generally oval shape. A longer inner diameter direction of the tubular portion 136 coincides with the lateral direction of the backdoor 14.

The smaller inner diameter of the tubular portion 136 is substantially the same as an outer diameter of the outer sheath portion 104. The sensor main body 102 is received inside of the tubular portion 136. A boundary between the rigid portion 132 and the soft portion 134 extends in the lateral direction of the backdoor 14.

Furthermore, each pressure sensor 100 includes a connector portion 140. The connector portion 140 extends from the rigid portion 132 on the side opposite the soft portion 134 and has a width smaller than the outer diameter of the tubular portion 136. An attachment portion 138 extends from the connector portion 140 on the side opposite the rigid portion 132. The connector portion 140 and the attachment portion 138 are formed of the same rubber material or the same synthetic resin material as that of the rigid portion 132 and extends in the longitudinal direction of the tubular portion 136.

The attachment portion 138 includes an attachment groove 142. The attachment groove 142 has an opening at the end of the attachment portion 138 on the side opposite the connector portion 140. At least one of opposed inner walls of the attachment groove 142 has a plurality of clamping pieces 144 (in this embodiment, both the inner walls of the attachment groove 142 have the clamping pieces 144). A metal support bracket 146 is secured to the inner panel 80 at one end. The other end of the support bracket 146 is received in the attachment groove 142. Furthermore, the other end of the support bracket 146 is resiliently clamped by the clamping pieces 144 in the attachment groove 142. In this way, the protector 130 (or the pressure sensor 100) is secured to the inner panel 80 (or the backdoor 14) through the support bracket 146.

Figure 3:
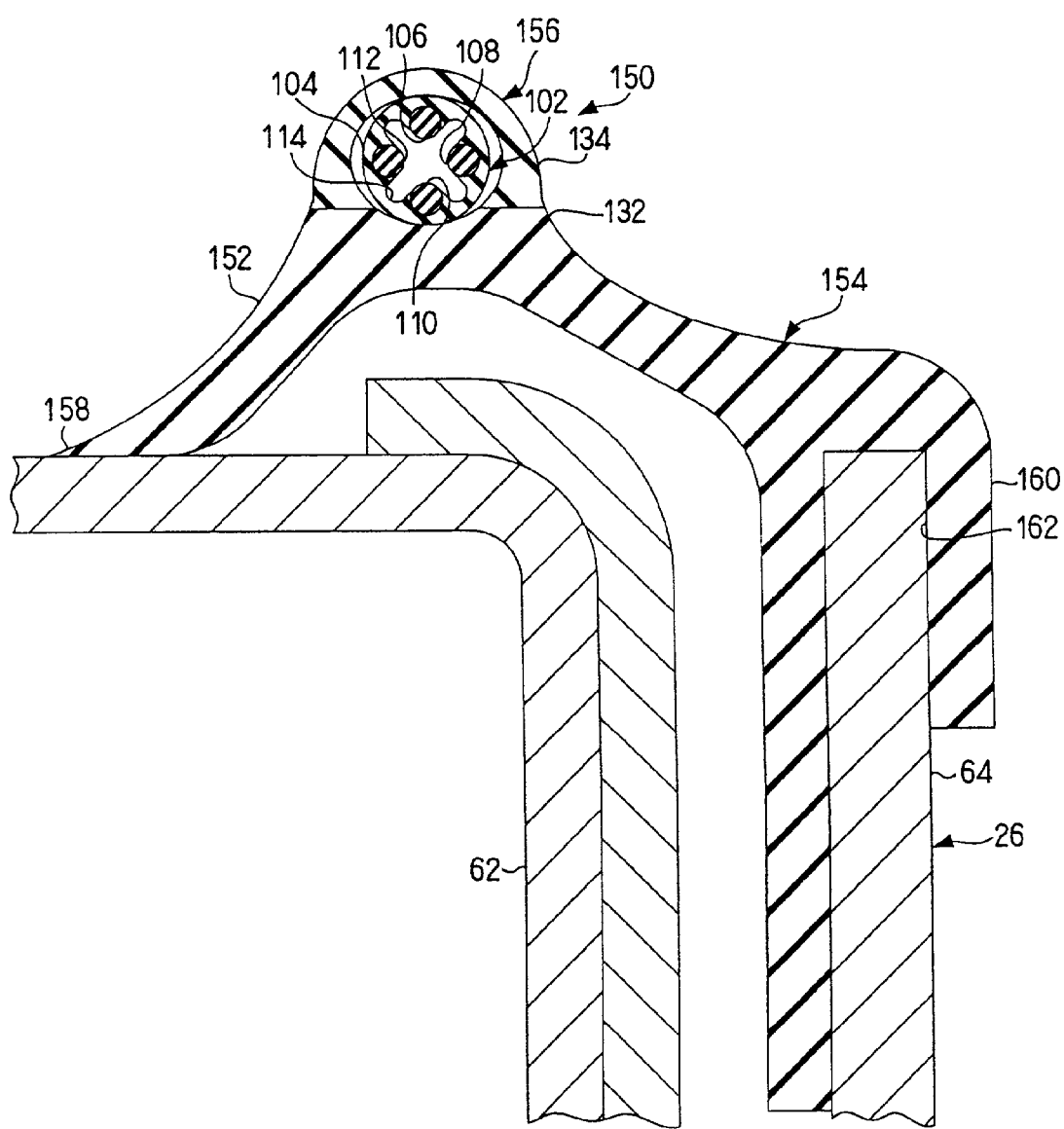
FIG. 3 is an enlarged cross-sectional view of another pressure sensor of the pinched object detection apparatus of FIG. 1, which is attached to a lateral wall of the vehicle.

Furthermore, with reference to FIG. 1, the pinched object detection apparatus 10 further includes a couple of pressure sensors 150, which extend along inner surfaces of lateral end portions of the rear gate 18, respectively. As shown in FIG. 3, similar to the pressure sensor 100, the pressure sensor 150 has a sensor main body 102. A structure of the sensor main body 102 of the pressure sensor 150 is basically the same as that of the sensor main body 102 of the pressure sensor 100. With reference to FIG. 6, the sensor main body 102 of each pressure sensor 150 is connected to the ECU 46 through a corresponding electrical current measurement element 122, which is provided separately and independently from the electrical current measurement elements 122 of the pressure sensors 100.

In the ECU 46, it is determined whether the external force is applied to the sensor main body 102 of the pressure sensor 100, as described above. Similarly, in the ECU 46, it is also determined whether an external force is applied to the sensor main body 102 of the pressure sensor 150. When the electrical signal from any one of the electrical current measurement elements 122 of the pressure sensors 100, 150 is inputted to the ECU 146, the ECU 146 controls the drivers 42, 58 to drive and rotate the backdoor motor 40 and the closer motor 52 in the forward direction (i.e., in the direction of raising the backdoor 14).

Furthermore, as shown in FIG. 3, each pressure sensor 150 includes a protector 152. The protector 152 has a base 154 made of a rubber material or a synthetic resin material similar to that of the rigid portion 132 of the pressure sensor 100. A rear end portion of the base 154 at a rear end side of the vehicle 16 has a tubular portion 156. As shown in FIG. 1, when the backdoor 14 is positioned to fully close the opening defined by the rear gate 18, the tubular portion 156 of each pressure sensor 150 is located inward of the tubular portion 136 of the corresponding pressure sensor 100 in the lateral direction of the vehicle 16. Similar to the tubular portion 136 of the pressure sensor 100, the tubular portion 156 of each pressure sensor 150 receives and covers the corresponding sensor main body 102.

The tubular portion 156 also includes a rigid portion 132 and a soft portion 134. When the backdoor 14 is positioned to fully close the opening defined by the rear gate 18, the soft portion 134 of the cylinder portion 156 is located on the backdoor 14 side of the corresponding rigid portion 132.

An inner end portion of the base 154, which is located laterally inward of the vehicle 16, forms a closely fitting portion 158. The closely fitting portion 158 closely fits against the bent portion of the inner panel 62 (lateral wall 26).

An attachment portion 160 is formed at an outer end portion of the base 154, which is located laterally outward of the vehicle 16. The attachment portion 160 has a attachment groove 162. The attachment groove 162 corresponds with a rear end portion of the outer panel 64, which constitutes the lateral wall 26. The attachment portion 160 and the base 154 are attached to the outer panel 64 or the lateral wall 26 when the rear end portion of the outer panel 64 is received in the attachment groove 162.

Operation and advantages of the first embodiment will be described.

For illustrative purposes, it is assumed that the rear gate 18 is now fully opened by swinging the backdoor 14 upwardly. At this state, when the backdoor switch 48 is operated to lower the backdoor 14, the ECU 46 controls the driver 42 and rotates the backdoor motor 40 in the backward direction to swing the backdoor 14 downwardly.

Next when the backdoor 14 is swung to a position just before fully closing the opening defined by the rear gate 18, the junction 54 and the junction 56 contact one another to conduct electrical current therebetween. When the ECU 46 determines tat the junction 54 and the junction 56 contact one another to conduct the electrical current therebetween, the ECU 46 controls the driver 42 to stop the backdoor motor 40 and also controls the driver 58 to rotate the closer motor 52. The closer motor 52 further swings the backdoor 14 to the fully closed position and activates a locking means, such as a latch to lock the backdoor 14 at the fully closed position.

As described above, in the automatic backdoor system 12 of the present embodiment, the closing operation of the backdoor 14 can be carried out only by operating the backdoor switch 48. Thus, in the case of closing the backdoor 14, the backdoor 14 can be easily closed without requiring a manual operation of the backdoor 14 with a hand.

In the case of swinging the backdoor 14 toward the rear gate 18, when an object 170 is present between the lateral end portion of the backdoor 14 and the opposing lateral wall 26 of the vehicle 16, more specifically, when the object 170 is placed over the inner surface of the lateral end portion of the rear gate 18 in a swing path of the backdoor 14, the backdoor 14 urges object 170 toward the interior of the vehicle 16.

Figure 8:
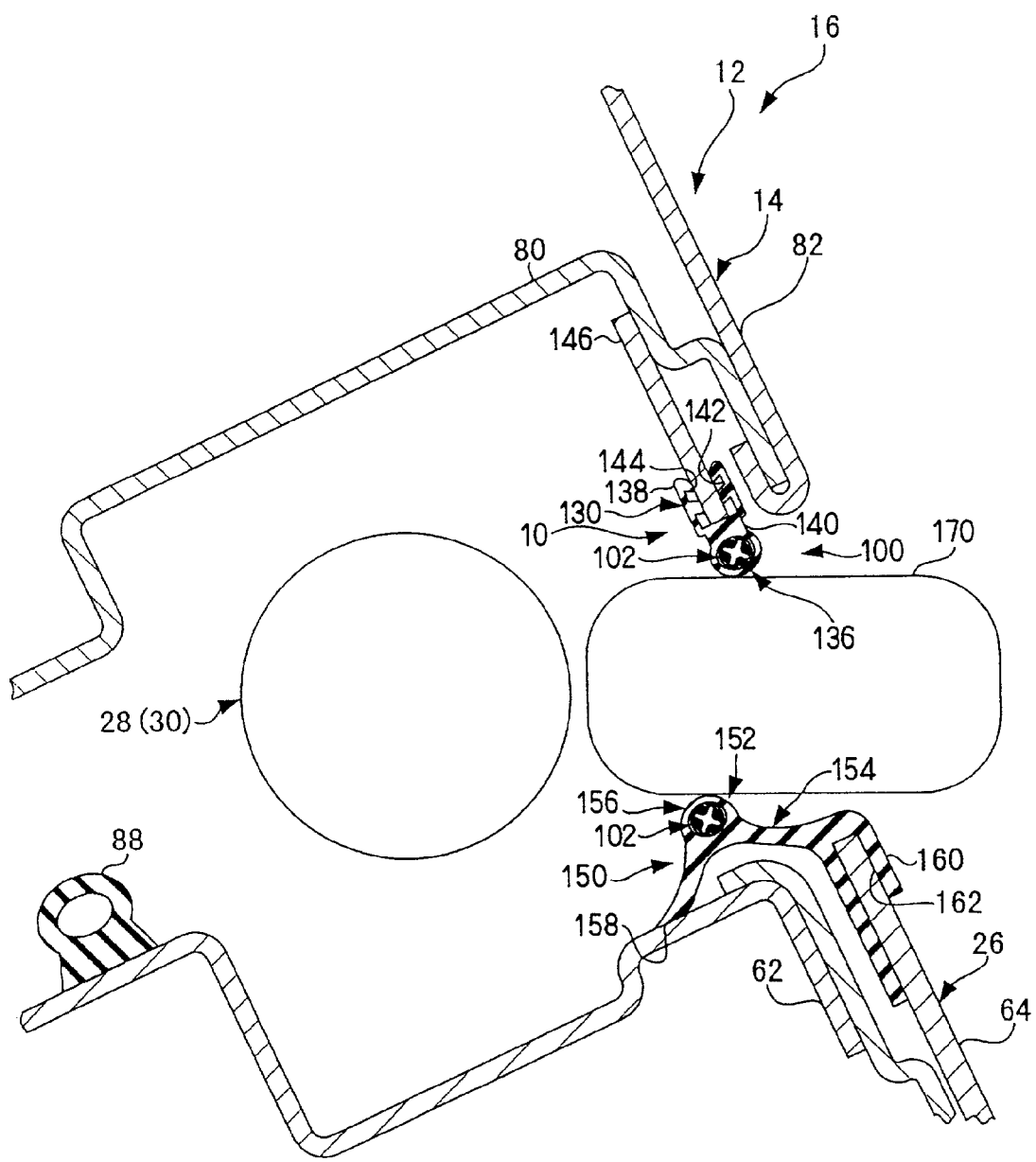
FIG. 8 is a partial cross-sectional view similar to that of FIG. 1, showing an object pinched between the backdoor and the lateral wall of the vehicle.

That is, the object 170 is pinched between the backdoor 14 and the opposing lateral wall 26, as shown in FIG. 8.

At this stage, the pressing force of the backdoor 14 is applied to the object 170 through the tubular portion 136 of the corresponding pressure sensor 100, and the object 170 provides the reaction force, which corresponds to the pressing force applied to the object 170, to the tubular portion 136. Furthermore, the object 170 conducts the pressing force of the backdoor 14 to the tubular portion 156 of the pressure sensor 150 arranged in the corresponding lateral wall 26. As described above, at least one of the tubular portions 136, 156, which receive the reaction force or the pressing force from the object 170, is elastically deformed.

In the present embodiment, the soft portion 134 of the tubular portion 136 is placed forward of the rigid portion 132 of the tubular portion 136 in a fore-aft direction of the vehicle 16. Also, the soft portion 134 of the tubular portion 156 is placed backward of the rigid portion 132 in the fore-aft direction of the vehicle 16. Thus, the object 170 contacts both the soft portion 134 of the tubular portion 136 and the soft portion 134 of the tubular portion 156. As a result, upon receiving the reaction force or the pressing force from the object 170, the soft portion 134 of the tubular portion 136 and the soft portion 134 of the tubular portion 156 are relatively easily, elastically deformed to conduct the reaction force or the pressing force from the object 170 to the outer sheath portions 104 of the sensor main bodies 102 received in the tubular portions 136, 156, respectively.

Both the tubular portions 136, 156 have the rigid portion 132 on the side of the soft portion 134 opposite the object 170. Thus, each sensor main body 102 is effectively supported by the rigid portion 132 when the sensor main body 102 receives the external force from the side opposite the rigid portion 132. As a result, when the sensor main body 102 receives the reaction force or the pressing force from the object 170 through the soft portion 134, the sensor main body 102 is not substantially displaced in a direction of the reaction force or a direction of the pressing force.

In this manner, the outer sheath portion 104 of each sensor main body 102 can be reliably, elastically deformed when it receives the reaction force or the pressing force from the object 170. When the outer sheath portion 104 of the sensor main body 102 is elastically deformed, the electrode wire 106 or 110 contacts with the electrode wire 108 or 112, resulting in short circuiting therebetween. In the short circuited state, the electrical current flows without passing through the resistor 116, so that the electrical current value of the electrical current, which passes through the electrical circuit including the electrode wires 106 to 112, changes.

The change in the electrical current value is sensed through the electrical current measurement element 122, and then the electrical current measurement element 122 outputs a detection signal (electrical signal) to the ECU 46. The ECU 46, which has received the detection signal, determines that the outer sheath portion 104 is deformed, i.e., the object 170 is pinched. Thus, the ECU 46 controls the drives 42, 58 to rotate the backdoor motor 40 and the closer motor 52 in the forward direction (i.e., in the direction of raising the backdoor 14). As a result, the pinched object 170 is released from the backdoor 14.

As described above, the amount of the forward rotation of each of the backdoor 40 and the closer motor 52 is not limited to any specific value. Thus, the backdoor motor 40 and the closer motor 52 can be rotated in the forward direction to raise the backdoor 14 until the backdoor 14 fully opens the opening defined by the rear gate 18. Alternatively, the backdoor motor 40 and the closer motor 52 can be rotated in the forward direction to raise the backdoor 14 until the backdoor 14 is raised for a few centimeters.

In comparison to the case where the backdoor 14 is raised until the opening defined by the rear gate 18 is fully opened, it is preferred to raise the backdoor only for a few centimeters for the following reason.

That is, in the case of raising the backdoor 14 until the opening defined by the rear gate 18 is fully opened, the swing motion of the backdoor 14 continues even after the pinched object 170 is released from the backdoor 14. Thus, if it is desired to fully close the opening defined by the rear gate 18 with the backdoor 14 once again, the backdoor 14 cannot be lowered until the backdoor 14 is raised to its upper end position. Furthermore, initiation of the downward swing motion of the backdoor 14 from the upper end position of the backdoor 14 requires a certain time. Thus, in the case of raising the backdoor 14 until the opening defined by the rear gate 18 is fully opened, time required for fully closing the rear opening wit the backdoor 14 becomes longer than the case where the backdoor 14 is raised only for a few centimeters.

Of course, the backdoor 14 can be stopped in the middle of the raising operation and can be then lowered once again by operating the backdoor switch 48. However, in such a case, the additional operation of stopping the backdoor 14 through the operation of the backdoor switch 48 is required, resulting in the tedious and time consuming operation.

In contrast to this, the object 170 can be generally freed and released by raising the backdoor 14 for a few centimeters after detection of the pinched object 170. If the backdoor 14 is stopped after it is raised for a few centimeters, an amount of required swing of the backdoor 14 for fully closing the opening of the rear gate 18 once again from that position is smaller in comparison to the case where the backdoor 14 is stopped at its upper end position. Thus, the time required for flatly closing the opening of the rear gate 18 once again can be accordingly reduced.

In the present embodiment, the pressure sensors 100 are arranged in the backdoor 14, and the pressure sensors 150 are arranged in the lateral walls 26 of the vehicle 16. Thus, when the object 170 is pinched in the manner described above, the outer sheath portion 104 of one of the opposed pressure sensor 100 and pressure sensor 150 is elastically deformed to cause a short circuit between the electrode wire 106 or 110 and the electrode wire 108 or 112. As a result, the backdoor motor 40 and the closer motor 52 are rotated in the forward direction (i.e., in the direction of raising the backdoor 14) even though the outer sheath portion 104 of the other one of the opposed pressure sensor 100 and pressure sensor 150 is not elastically deformed to cause a short circuit between the electrode wire 106 or 110 and the electrode wire 108 or 112. This allows quicker and more reliable release of the pinched object 170.

Furthermore, by way of example, even if the pressure sensor 100 has an insensible zone, and the object 170 contacts the insensible zone of the pressure sensor 100, the pressure sensor 100 cannot detect the pinched object 170.

However, even in such a case, the pinched object 170 can be detected with the opposed pressure sensor 150, resulting in the improved reliability in the detection of the pinched object 170.

In the vehicle 16, each gas damper 28 is arranged between the backdoor 14 and the corresponding lateral wall 26. When the backdoor 14 is swung downward to close the opening of the rear gate 18, the gas damper 28 is displaced forward in the fore-aft direction of the vehicle 16 while the gas damper 28 is swung about the connection between the gas damper 28 and the backdoor 14 and also about the connection between the gas damper 28 and the corresponding lateral wall 26.

Figure 9:
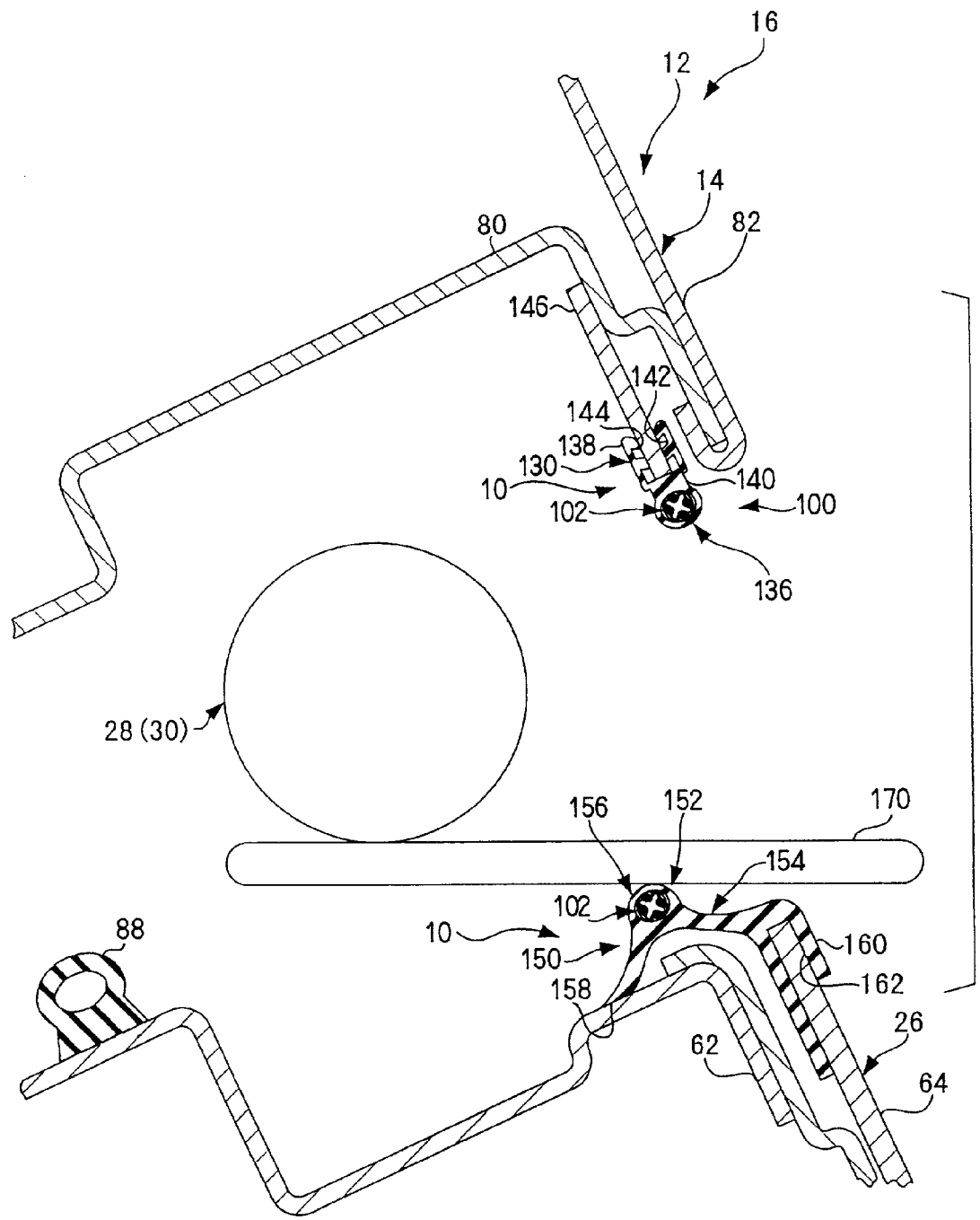
FIG. 9 is a partial cross-sectional view similar to that of FIG. 1, showing an object pinched between a gas damper and the lateral wall of the vehicle.

During this operation, as shown in FIG. 1, the gas damper 28 is always swung ahead of the backdoor 14. Thus, when the object 170 is pinched between the gas damper 28 and the corresponding lateral wall 26, the object 170 does not engage with the pressure sensor 100, as shown in FIG. 9.

However, even in such a case, the object 170 engages with the tubular portion 156 of the pressure sensor 150 arranged in the lateral wall 26. Thus, the tubular portion 156 of the pressure sensor 150 is elastically deformed by the pressing force applied from the gas damper 28 through the object 170, so that the sensor main body 102 received within the tubular portion 156 is elastically deformed to cause rotation of the backdoor motor 40 and the closer motor 52 in the forward direction (i.e., in the direction of raising the backdoor 14), allowing release of the pinched object 170.

As described above, according to the present embodiment, it is possible to detect the object 170 pinched between the lateral wall 26 and the backdoor 14 and also the object 170 pinched between the lateral wall 26 and the gas damper 28. Thus, the reliability of the detection of the pinched object 170 is further improved.

In the present embodiment, the pressure sensors 150 are arranged in the lateral walls 26, and the pressure sensors 100 are arranged in the backdoor 14. However, the pressure sensors 100 arranged in the backdoor 14 can be eliminated. That is, as described above, each pressure sensor 100 arranged in the backdoor 14 can detect the object 170 pinched between the backdoor 14 and the corresponding lateral wall 26 but cannot detect the object 170 pinched between the gas damper 28 and the corresponding lateral wall 26.

On the other hand, each pressure sensor 150 arranged in the corresponding lateral wall 26 can detect both the object 170 pinched between the backdoor 14 and the corresponding lateral wall 26 and the object 170 pinched between the gas damper 28 and the lateral wall 26. Thus, even if the pressure sensors 100 are not arranged in the backdoor 14, the object 170 pinched between the backdoor 14 and the lateral wall 26 can be effectively detected.

(Second Embodiment)

Figure 10:
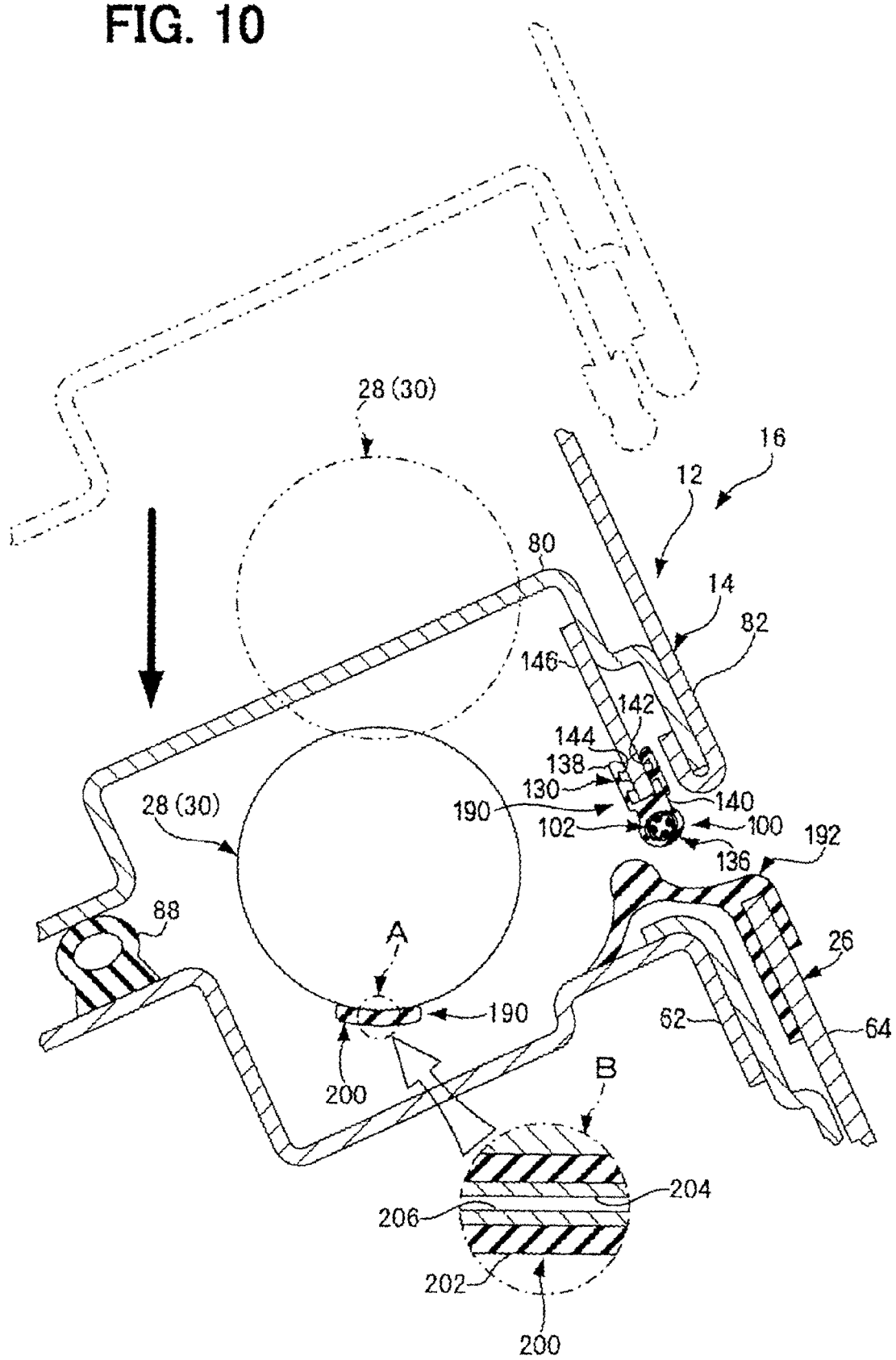
FIG. 10 is a partial cross-sectional view similar to that of FIG. 1, showing a pinched object detection apparatus according to a second embodiment of the present invention.

FIG. 10 is a cross-sectional view similar to that of FIG. 1 and shows a main feature of a pinched object detection apparatus 190 according to a second embodiment of the present invention as well as a main feature of the vehicle 16, which is equipped with the pinched object detection apparatus 190 of the second embodiment.

As shown in FIG. 10, the pinched object detection apparatus 190 of the present embodiment differs from the pinched object detection apparatus 10 of the first embodiment in that the pinched object detection apparatus 190 of the present embodiment does not have the pressure sensors 150 and thus does not have the protectors 152. Thus, in place of the protectors 152, weather strips 192 are attached to the rear end portions of the outer panels 64 of the lateral walls 26, respectively.

Furthermore, in place of the pressure sensors 150, the pinched object detection apparatus 190 includes pressure sensors 200 attached to the gas dampers 28 (more specifically, the cylinders 30 of the gas dampers 28), respectively. Each pressure sensor 200 includes an outer sheath portion 202. A longitudinal direction of the outer sheath portion 202 extends in an axial direction of the corresponding gas damper 28. The outer sheath portion 202 has a generally rectangular cross-section. One outer surface of the outer sheath portion 202 located on one widthwise side of the rectangular cross-section of the outer sheath portion 202 has a bonding means (not shown), such as an adhesive, and is bonded to a front facing portion of an outer peripheral surface of the gas damper 28 (cylinder 30), which generally faces toward a front side of the vehicle 16.

With reference to FIG. 10, as shown in a circled area B, which is an enlarged view of a circled area A, the outer sheath portion 202 has a hollow portion, which has a rectangular cross-section. In the hollow portion of the outer sheath portion 202, a thin plate electrode 204 is integrally bonded to one of opposed inner walls, which oppose one another in a thickness direction of the hollow portion, and another thin plate electrode 206 is integrally bonded to the other one of the opposed inner walls. As shown in the circled area B in FIG. 10, the electrode 204 and the electrode 206 do not normally contact one another to conduct the electrical current therebetween. However, when the external force is applied to the outer sheath portion 202 to elastically deform the outer sheath portion 202 in the thickness direction of the outer sheath portion 202, at least one of the electrodes 202, 206 is deformed to move toward the other one of the electrodes 202, 206. Thus, the electrode 204 and the electrode 206 contact one another to conduct the electrical current therebetween.

Figure 12:
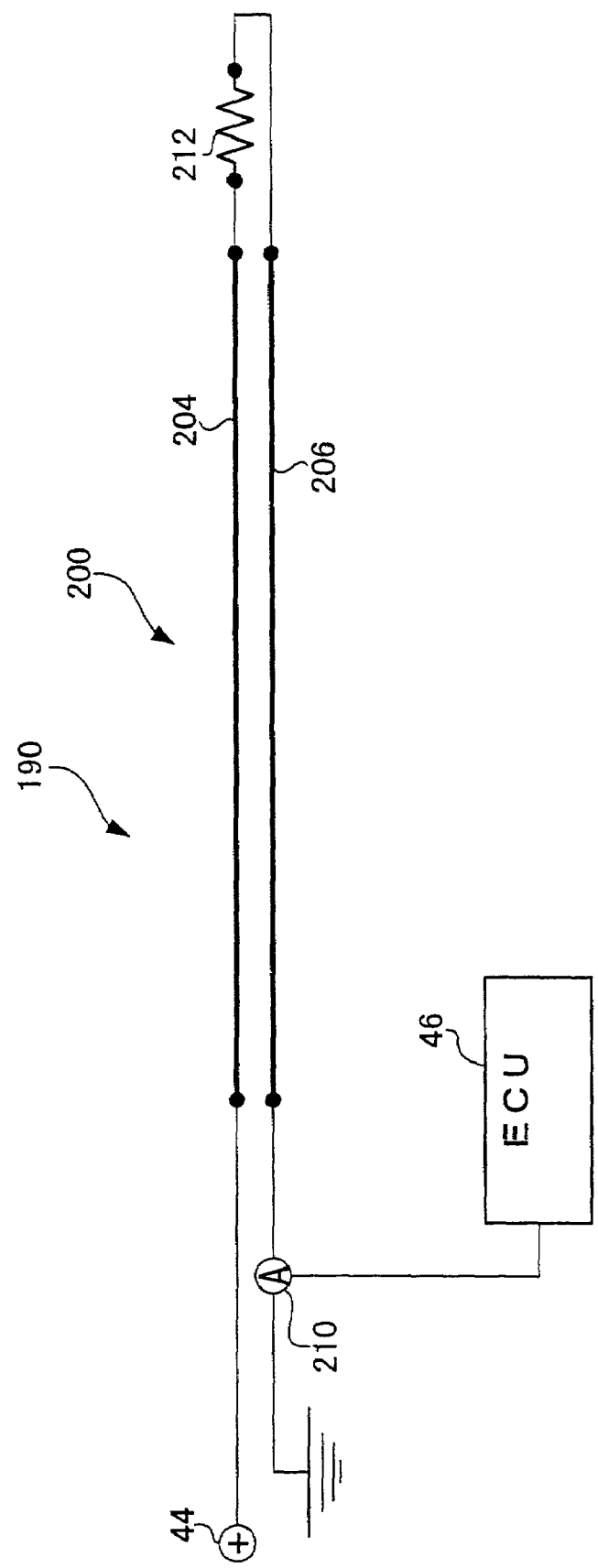
FIG. 12 is a circuit diagram, showing a structure of a pressure sensor of the pinched object detection apparatus of the second embodiment, which is attached to the gas damper of the vehicle.

Furthermore, as shown in FIG. 12, a resistor 212 is provided between one end of the electrode 204 and one end of the electrode 206. The electrode 204, the resistor 212 and the electrode 206 are electrically connected in series. The other end of the electrode 206 is grounded, for example, through a cord. An electrical current measurement element 210 for measuring electrical current flowing through the electrode 206 is interposed between the electrode 206 and the ground.

The electrical current, which has conducted through the electrode 204, is normally conducted to the electrode 206 through the resistor 212. When the electrode 204 and the electrode 206 contact one another to cause a short circuit therebetween, the electrical current flows between the electrode 204 and the electrode 206 without passing through the resistor 212. Thus, as long as the electrical current is supplied at a constant voltage, the electrical current value of the electrical current, which passes through the electrode 206, changes. The short circuit between the electrode 204 and the electrode 206 can be detected by measuring the change in the electrical current value with the electrical current measurement element 210.

Figure 11:
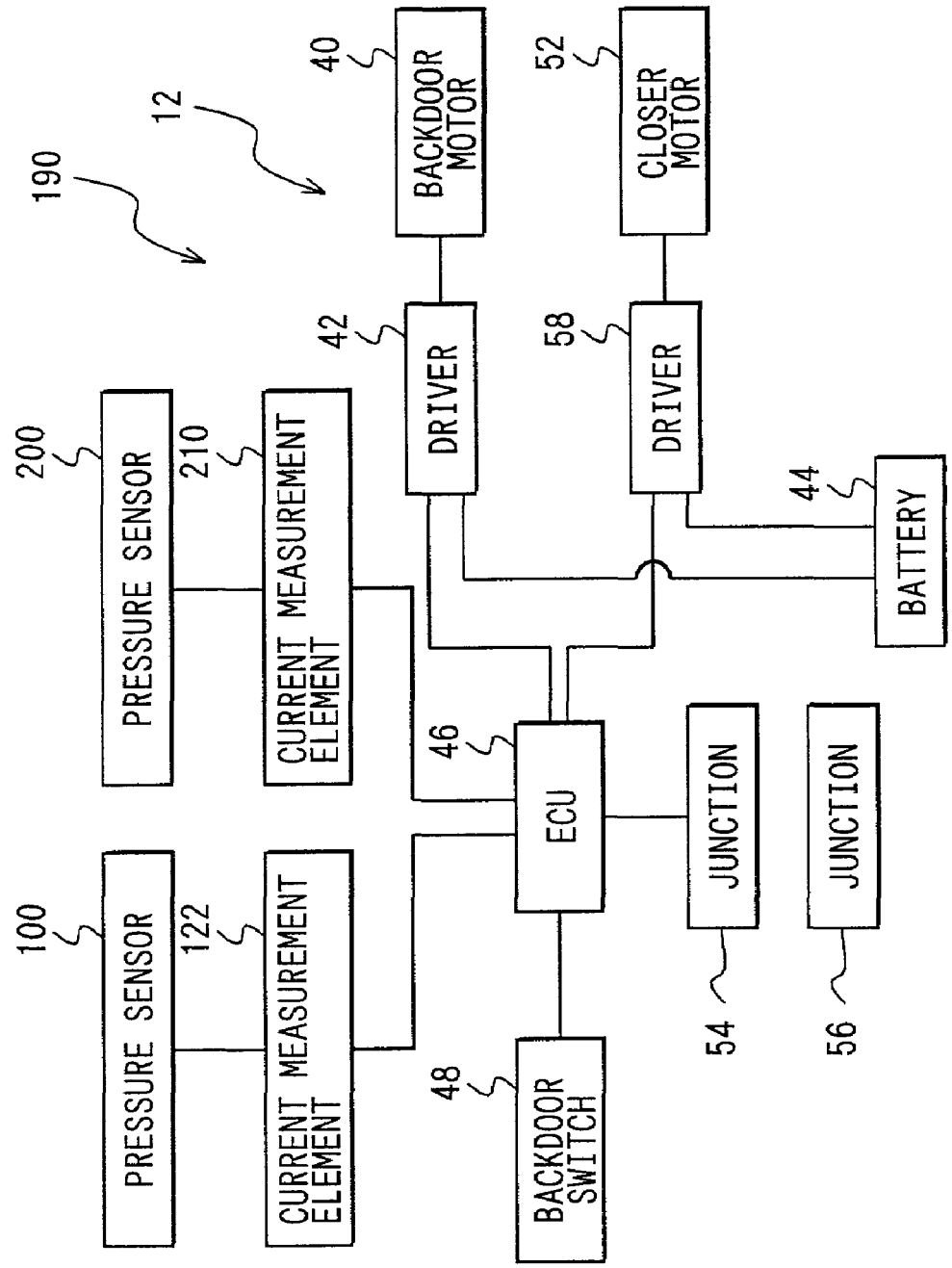
FIG. 11 is a systematic block diagram, showing a structure of the pinched object detection apparatus of the second embodiment.

As shown in FIG. 11, the electrical current measurement element 210 is directly or indirectly connected to the ECU 46. Upon detection of the short circuit between the electrode 204 and the electrode 206 through the electrical current measurement element 210, the ECU 46 controls the drivers 42, 58 to rotate the backdoor motor 40 and the closer motor 52 in the forward direction (i.e., in the direction of raising the backdoor 14).

Operation and advantages of the second embodiment will be described.

Figure 13:
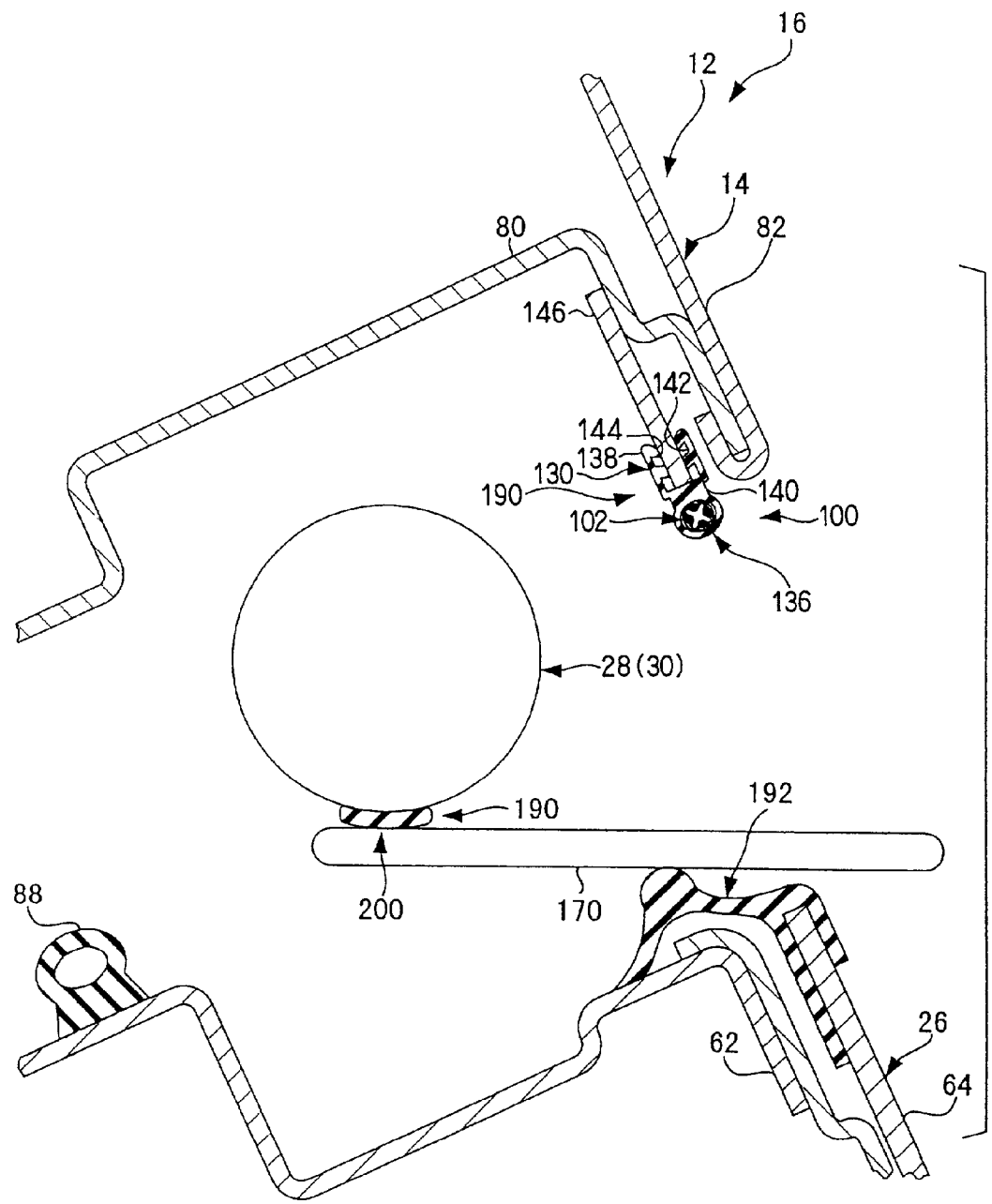
FIG. 13 is a partial cross-sectional view similar to that of FIG. 10, showing an object pinched between the gas damper and the lateral wall of the vehicle.

In the second embodiment, in the case of closing the opening of the rear gate 18 by lowering the backdoor 14, when the object 170 is pinched between the gas damper 28 and the corresponding lateral wall 26, the object 170 does not engage with the pressure sensor 100, as shown in FIG. 13. However, in such a case, because of the pressure sensor 200 arranged in the front facing portion of the outer peripheral surface of the gas damper 28 (cylinder 30), the object 170 still engages with and presses the outer sheath portion 202 of the pressure sensor 200 when the object 170 is pinched between the gas damper 28 and the lateral wall 26.

A portion of the outer sheath portion 202, which contacts with the object 170 and receives the pressing force from the object 170, is elastically deformed toward the gas damper 28 side. Thus, the electrode 206 is deformed to move toward and contacts with the electrode 204. This causes a short circuit between the electrode 204 and the electrode 206, thus resulting in a change in the electrical current value of the electrical current, which passes through the electrode 206. As described above, the short circuit between the electrode 204 and the electrode 206 is sensed through the electrical current measurement element 210, and a detection signal indicative of the short circuit is outputted from the electrical current measurement element 210 to the ECU 46.

When the ECU 46 receives the detection signal, which is outputted from the electrical current measurement element 210 upon detection of the short circuit between the electrode 204 and the electrode 206, the ECU 46 controls the drivers 42, 58 to rotate the backdoor motor 40 and the closer motor 52 in the forward direction (i.e., in the direction of raising the backdoor 14). Thus, the object 170 pinched between the gas damper 28 and the corresponding lateral wall 26 is released.

According to the second embodiment, as described above, although the pressure sensor 100 cannot detect the object 170 pinched between the gas damper 28 and the lateral wall 26, the provision of the pressure sensor 200 at the gas damper 28 allows detection and release of such an object 170 pinched between the gas damper 28 and the lateral wall 26.

In the second embodiment, each pressure sensor 200 is provided at the front facing portion of the outer peripheral surface of the gas damper 28 (cylinder 30), which generally faces toward the front side of the vehicle 16. However, each pressure sensor 200 can be provided at an opposing portion of the corresponding lateral wall 26 of the vehicle 16, which opposes the front facing portion of the outer peripheral surface of the gas damper 28 (cylinder 30) or which is located in an imaginary extension of a moving path of the gas damper 28. Even with this arrangement, advantages similar to those discussed above in the second embodiment can be achieved.

Furthermore, in place of the pressure sensors 200, pressure sensors, which are similar to the pressure sensors 100, 150 and thus have spirally wound electrodes, can be arranged at the gas dampers 28, respectively.

(Third Embodiment)

A third embodiment of the present invention will be described.

Figure 14:
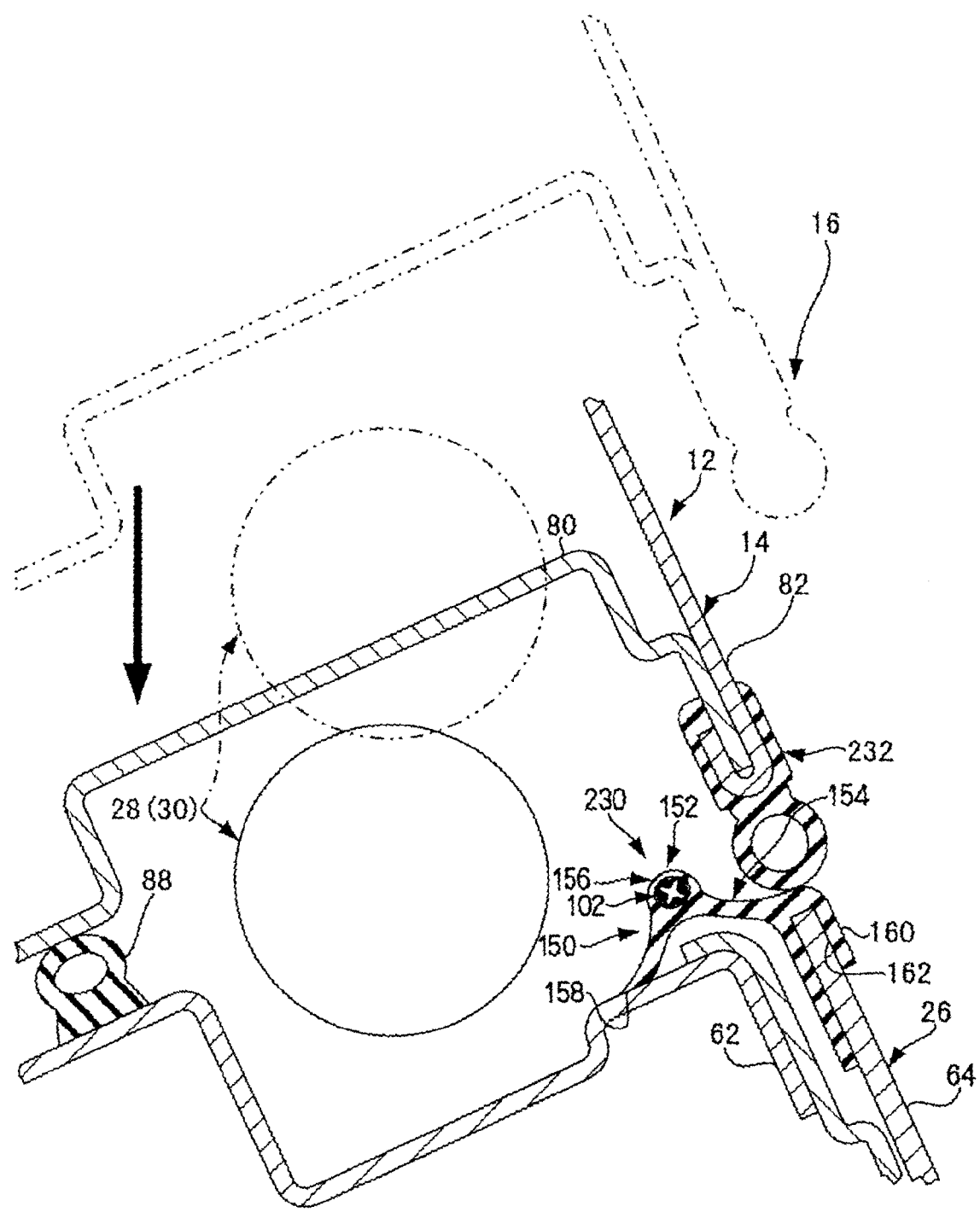
FIG. 14 is a partial cross-sectional view similar to that of FIG. 1, showing a pinched object detection apparatus according to a third embodiment of the present invention.

FIG. 14 is a cross-sectional view similar to that of FIG. 1 and shows a main feature of a pinched object detection apparatus 230 according to a third embodiment of the present invention as well as a main feature of the vehicle 16, which is equipped with the pinched object detection apparatus 230 of the third embodiment.

As shown in FIG. 14, the pinched object detection apparatus 230 of the present embodiment differs from the pinched object detection apparatus 10 of the first embodiment in that the pinched object detection apparatus 230 of the present embodiment does not have the pressure sensors 100 and thus does not have the protectors 130. Thus, in place of the protectors 130, weather strips 232 are attached to the outer panels 82 of the lateral walls 26, respectively. That is, in the first embodiment, the protectors 130 of the pressure sensors 100 also have a role of the strip 232.

Figure 15:
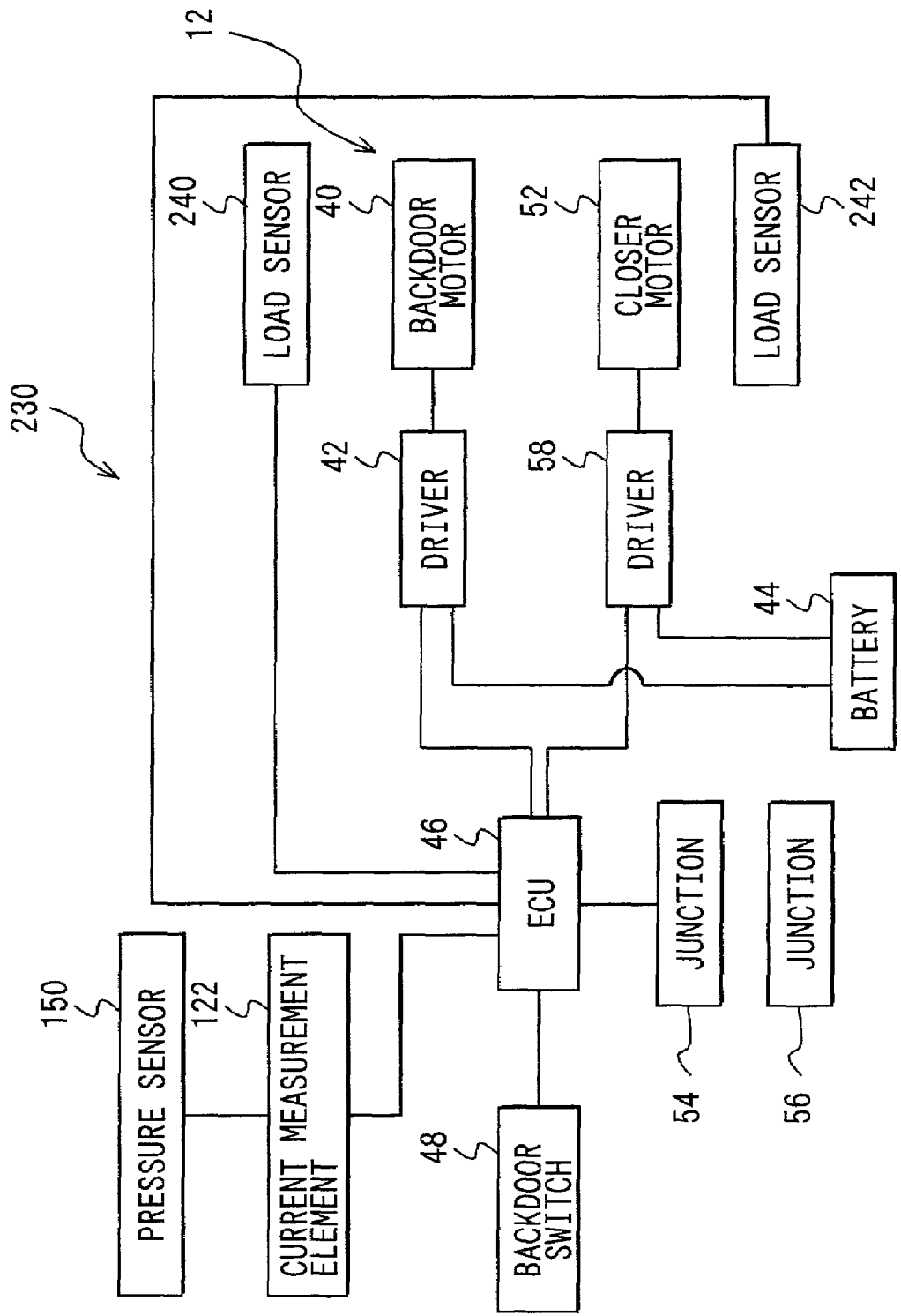
FIG. 15 is a systematic block diagram, showing a structure of the pinched object detection apparatus of the third embodiment.

With reference to FIG. 15, in place of the pressure sensors 100, the pinched object detection apparatus 230 has load sensors (acting as a load measuring means) 240, 242. The load sensor 240 is provided for the backdoor motor 40 and measures a load applied to the backdoor motor 40. Furthermore, the load sensor 240 is directly or indirectly connected to the ECU 46. When the load sensor 240 measures a load, which is applied to the backdoor motor 40, equal to or greater than a predetermined value, the load sensor 240 outputs a detection signal to the ECU 46.

On the other hand, the load sensor 242 is provided for the closer motor 52 and measures a load, which is applied to the closer motor 52. Similar to the load sensor 240, the load sensor 242 is directly or indirectly connected to the ECU 46. When the load sensor 242 measures a load, which is applied to the closer motor 52, equal to or greater than a predetermined value, the load sensor 242 outputs a detection signal to the ECU 46.

The ECU 46, to which the load sensors 240, 242 are connected, controls the drivers 42, 58 to rotate the backdoor motor 40 and the closer motor 52 in the forward direction (i.e., in the direction of raising the backdoor 14) when the pressure sensor 150 detects the pinched object. Furthermore, the ECU 46 controls the drivers 42, 58 to rotate the backdoor motor 40 and the closer motor 52 in the forward direction (i.e., in the direction of raising the backdoor 14) when the ECU 46 receives the detection signal indicative of the load equal to greater than the predetermined value from the load sensor 240 or 242.

Operation and advantages of the third embodiment will be described.

The reaction force from the object 170 is applied to the backdoor 14 to prevent the further swing motion of the backdoor 14. At this stage, similar to the first embodiment, if the outer sheath portion 104 of the pressure sensor 150 is elastically deformed, the object 170, which is pinched between the backdoor 14 and the lateral wall 26, can be detected with the pressure sensor 150.

Figure 16:
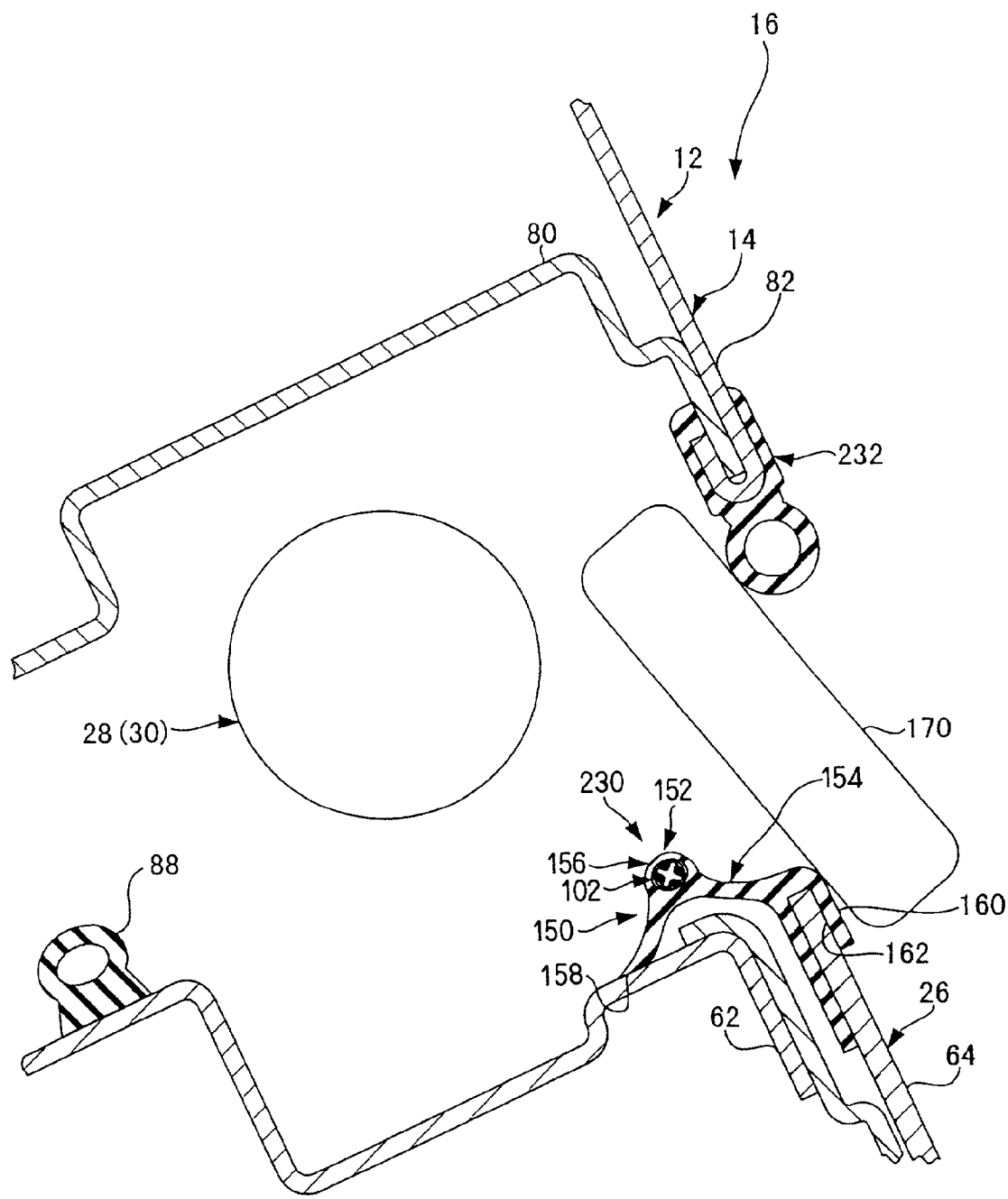
FIG. 16 is a partial cross-sectional view similar to that of FIG. 14, showing an object pinched between the backdoor and the lateral wall of the vehicle.

On the other hand, as shown in FIG. 16, in the case where the reaction force from the object 170 is applied to the backdoor 14 to prevent the further swing motion of the backdoor 14, it could happen that the pressing force applied from the object 170 does not cause elastic deformation of the outer sheath portion 104 of the pressure sensor 150. In such a case, due to the fact that the further swing motion of the backdoor 14 is prevented, the load applied to the backdoor motor 40 or the closer motor 52 becomes greater than a load applied to the backdoor motor 40 or the closer motor 52 during the smooth swing motion of the backdoor 14 toward the rear gate 18. When such a load, which is equal to or greater than the predetermined value, is applied to the load sensor 240 or the load sensor 242, the corresponding detection signal is outputted therefrom to the ECU 46. Then, the ECU 46 controls the drivers 42, 58 to rotate the backdoor motor 40 and the closer motor 52 in the forward direction (i.e., in the direction of raising the backdoor 14). As a result, the pinched object 170 is released.

In the present embodiment, unlike the first embodiment, the pinched object detection apparatus 230 does not include the pressure sensors 100. However, the pinched object detection apparatus 230 includes the load sensors 240, 242. When the load sensor 240 or 242 detects the load equal to or greater than the predetermined value, the backdoor motor 40 and the closer motor 52 are rotated in the forward direction to release the pinched object 170. Thus, even if the object 170 is pinched at the insensible zone of the pressure sensor 150 and/or even if the pinched object 170, which is pinched between the backdoor 14 and the lateral wall 26, does not cause the elastic deformation of the outer sheath portion 104 of the pressure sensor 150 due to size and/or position of the pinched object 170, the pinched object detection apparatus 230 allows reliable and quick release of the pinched object 170.

In each of the first to third embodiments, each sensor main body 102 has the four electrode wires 106–112, which are spirally wound along the cross hole 114 within the outer sheath portion 104. However, the sensor main body is not limited to this arrangement and can be any one that can sense the applied external force.

Furthermore, in each of the first to third embodiments, the pinched object detection apparatus 10, 190, 230 is applied to the automatic backdoor system 12, in which the backdoor 14 is swung about the swing axis that extends in the lateral direction of the vehicle 16. However, the invention can be applied to an automatic backdoor system, in which a backdoor swings about a swing axis that generally extends in a vertical direction of the vehicle 16.

Also, the present invention can be applied to an automatic luggage door system, in which a luggage door for closing a luggage room of a vehicle, such as a sedan, is automatically closed. Furthermore, the present invention can be applied to an automatic door, such as an automatic door of a taxi, in which a door panel for closing a door opening formed in a side of a vehicle body is automatically closed.

Furthermore, the present invention can be applied to any automatic door, such as an automatic door of a train or any other vehicle or an automatic door of any architecture.

Figure 17:
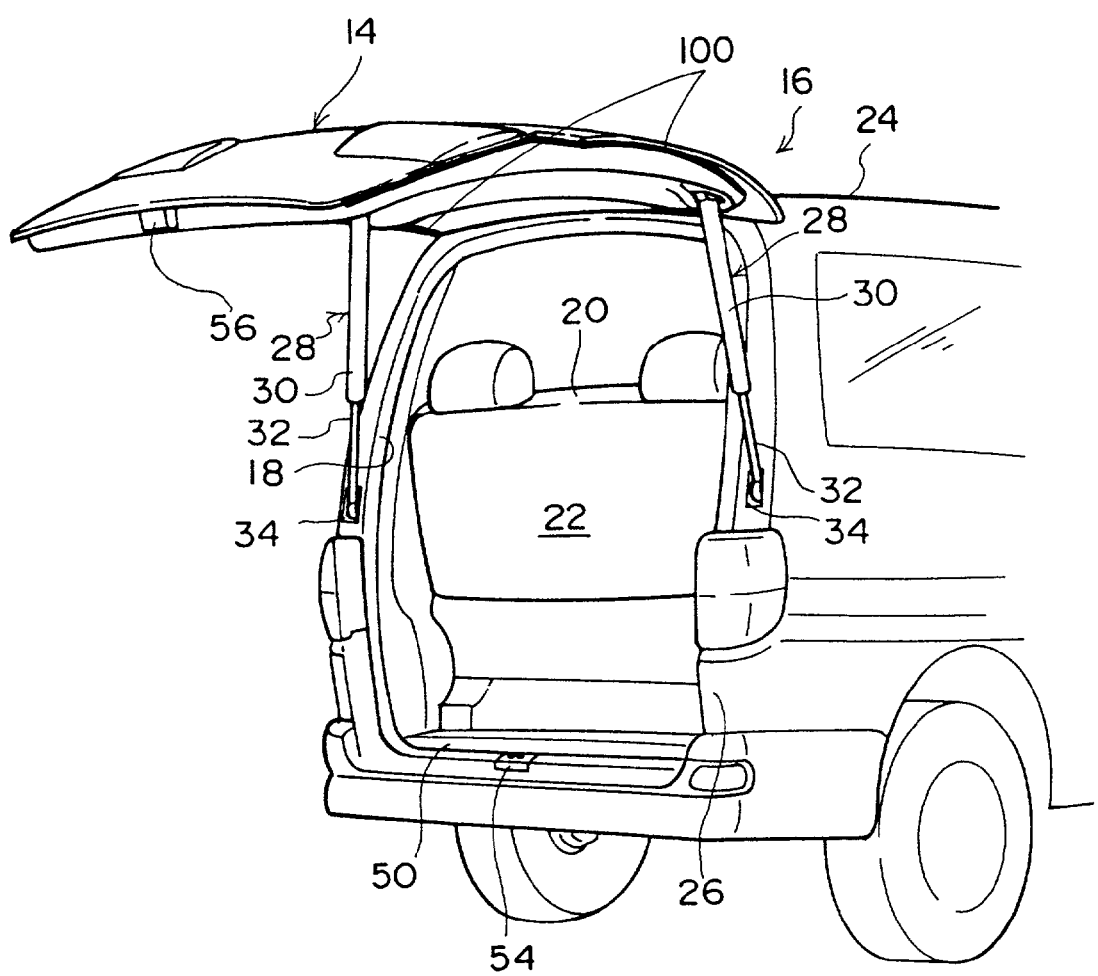
FIG. 17 is a partial perspective view similar to that of FIG. 7, showing a modification of the pinched object detection apparatus.

In addition, the pressure sensors 150 of the pinched object detection apparatus 10 of the first embodiment can be eliminated, so that the pinched object detection apparatus 10 only has the pressure sensors 100, as shown in FIG. 17. In this instance, when one of the pressure sensors 100 detects the pressing force or reaction force applied thereto from the pinched object, the ECU 46 controls the drivers 42, 58 to rotate the backdoor motor 40 and the closer motor 52 in the forward direction (i.e., in the direction of raising the backdoor 14).

Figure 18:
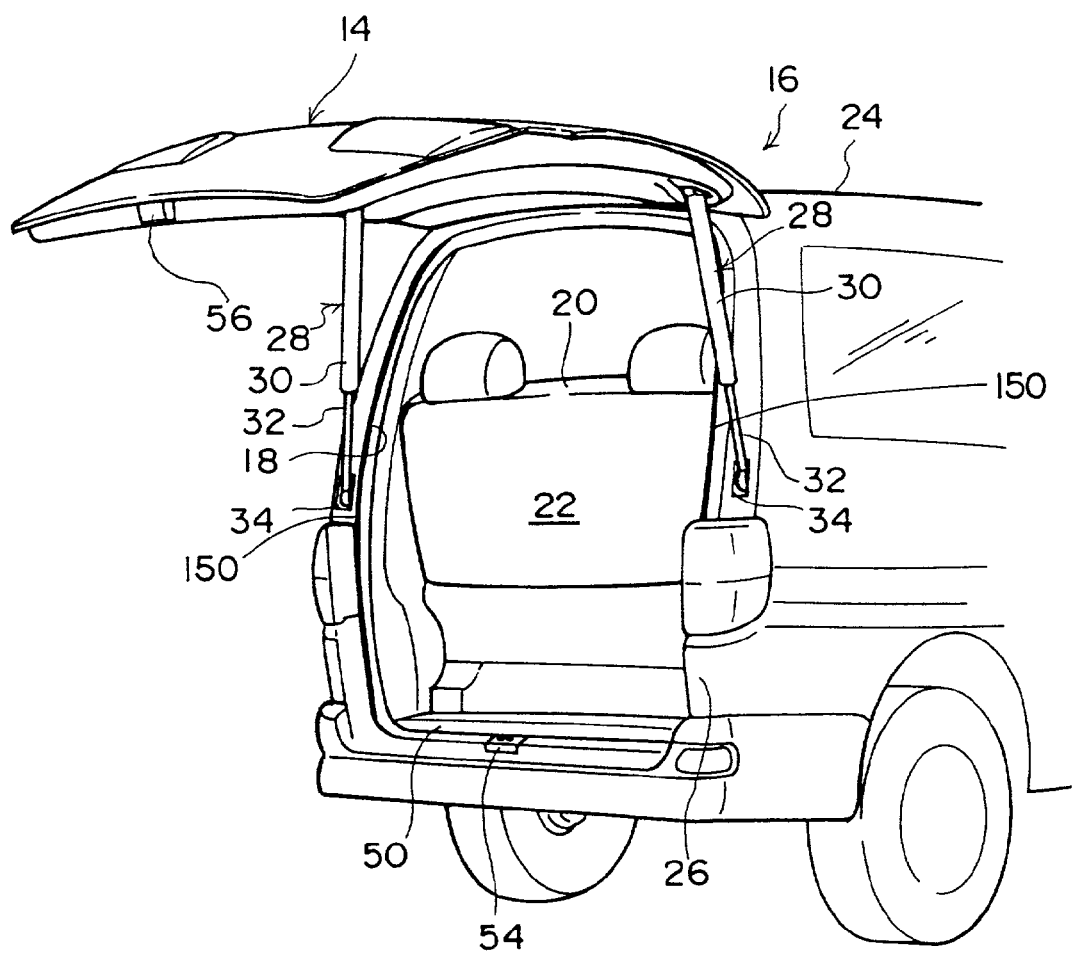
FIG. 18 is a partial perspective view similar to that of FIG. 7, showing another modification of the pinched object detection apparatus.

Alternatively, the pressure sensors 100 of the pinched object detection apparatus 10 of the first embodiment can be eliminated, so that the pinched object detection apparatus 10 only has the pressure sensors 150, as shown in FIG. 18. In this instance, when one of the pressure sensors 150 detects the pressing force or reaction force applied thereto from the pinched object, the ECU 46 controls the drivers 42, 58 to rotate the backdoor motor 40 and the closer motor 52 in the forward direction (i.e., in the direction of raising the backdoor 14).

Furthermore, in the above embodiments, the two pressure sensors 100 can be replaced with a single pressure sensor, which is similar to the pressure sensors 100 and extends continuously along the entire outer peripheral portion of the backdoor 14. Alternatively, in addition to or instead of the two pressure sensors 100, a pressure sensor similar to the pressure sensors 100 can be placed along a lower end portion of the backdoor 14 or along at least a portion of the outer peripheral portion of the backdoor 14.

Also, in the above embodiments, the two pressure sensors 150 can be replaced with a single pressure sensor, which is similar to the pressure sensors 150 and extends continuously along the entire inner peripheral portion of the rear gate 18. Alternatively, in addition to or instead of the two pressure sensors 150, a pressure sensor similar to the pressure sensors 150 can be placed along a lower end portion of the rear gate 18 or along at least a portion of the inner peripheral portion of the rear gate 18.

Additional advantages and modifications will readily occur to those skilled in the art. The invention in its broader terms is therefore, not limited to the specific details, representative apparatus, and illustrative examples shown and described.

What is claimed is:

1. A backdoor system, the backdoor system comprising:
   a rear gate that defines an opening;
   a backdoor that swings toward and away from the opening of the rear gate;
   a cushioning device that is connected between the rear gate and the backdoor and cushions the backdoor relative to the rear gate; and
   a gate-side pressure sensor that is placed on the rear gate at a location next to the cushioning device to detect both of:
   a pinched object that is pinched between the rear gate and the cushioning device; and
   a pinched object that is pinched between the rear gate and the backdoor;
   a backdoor-side pressure sensor that is placed on a peripheral location of the backdoor to detect the pinched object that is pinched between the rear gate and the backdoor, wherein
   when the backdoor is positioned to fully close the opening of the rear gate, the gate-side pressure sensor is opposed to the backdoor-side pressure sensor and is spaced apart from the backdoor-side pressure sensor,
   when the backdoor is positioned to fully close the opening of the rear gate, the backdoor-side pressure sensor, the gate-side pressure sensor and the cushioning device are arranged in this order from outside the rear gate toward a center of the opening in a direction perpendicular to a swing direction of the backdoor, and
   the cushioning device is a gas damper.

2. The backdoor system according to claim 1, wherein when the backdoor is positioned to fully close the opening, the gate-side pressure sensor at least partially overlaps with the cushioning device in the direction perpendicular to the swing direction of the backdoor.

3. The backdoor system according to claim 1, further comprising:
   a motor that drives the backdoor; and
   a control means for controlling the motor based on a signal outputted from the gate-side pressure sensor, wherein:
   the control means rotates the motor in a forward direction to swing the backdoor away from the opening of the rear gate and rotates the motor in a backward direction to swing the backdoor toward the opening of the rear gate; and
   the control means rotates the motor in the forward direction when the signal of the gate-side pressure sensor is a detection signal that indicates detection of a pinched object.

4. The backdoor system according to claim 3, wherein when the control means receives the detection signal from the gate-side pressure sensor, the control means rotates the motor in the forward direction by a predetermined amount to place the backdoor in an intermediate location, which is between a fully closed position and a fully opened position of the backdoor.

5. The backdoor system according to claim 1, wherein the backdoor-side sensor also detects the pinched object that is pinched between the rear gate and the cushioning device.

6. The backdoor system according to claim 1, further comprising:
   a motor that drives the backdoor; and
   a control means for controlling the motor based on a signal outputted from the gate-side pressure sensor and a signal outputted from the backdoor-side pressure sensor, wherein:
   the control means rotates the motor in a forward direction to swing the backdoor away from the opening of the rear gate and rotates the motor in a backward direction to swing the backdoor toward the opening of the rear gate; and
   the control means rotates the motor in the forward direction when at least one of the signal of the gate-side pressure sensor and the signal of the backdoor-side pressure sensor is a detection signal that indicates detection of a pinched object.

7. The backdoor system according to claim 6, wherein when the control means receives the detection signal, the control means rotates the motor in the forward direction by a predetermined amount to place the backdoor in an intermediate location, which is between a fully closed position and a fully opened position of the backdoor.

* * * * *